(12) United States Patent  (10) Patent No.: US 12,225,718 B2
Shao et al.                (45) Date of Patent:     Feb. 11, 2025

(54) SEMICONDUCTOR STRUCTURE AND METHOD FOR FORMING SEMICONDUCTOR STRUCTURE

(71) Applicant: CHANGXIN MEMORY TECHNOLOGIES, INC., Hefei (CN)

(72) Inventors: Guangsu Shao, Hefei (CN); Deyuan Xiao, Hefei (CN); Yunsong Qiu, Hefei (CN); Xingsong Su, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 306 days.

(21) Appl. No.: 17/880,926

(22) Filed: Aug. 4, 2022

(65)  Prior Publication Data
US 2023/0345712 A1  Oct. 26, 2023

Related U.S. Application Data

(63) Continuation of application No. PCT/CN2022/095920, filed on May 30, 2022.

(30)  Foreign Application Priority Data

Apr. 21, 2022 (CN) .......................... 202210419984.1

(51) Int. Cl.
*H10B 20/00* (2023.01)
*G11C 8/14* (2006.01)
*H10B 12/00* (2023.01)

(52) U.S. Cl.
CPC .............. *H10B 12/50* (2023.02); *G11C 8/14* (2013.01); *H10B 12/30* (2023.02); *H10B 12/482* (2023.02); *H10B 12/488* (2023.02)

(58) Field of Classification Search
CPC .... H10B 12/488; H10B 12/482; H10B 12/05; H10B 12/30; H10B 12/50; H10B 12/03;
(Continued)

(56)  References Cited

U.S. PATENT DOCUMENTS 12,010,829 B2 * 6/2024 Kim ................... H10B 12/488
2020/0083225 A1   3/2020 Ma
(Continued)

FOREIGN PATENT DOCUMENTS

CN    108807401 A   11/2018
CN    113889473 A    1/2022
(Continued)

OTHER PUBLICATIONS

International Search Report in the international application No. PCT/CN2022/095920, mailed on Dec. 22, 2022, 3 pages.

*Primary Examiner* — Thong Q Le
(74) *Attorney, Agent, or Firm* — Syncoda LLC; Feng Ma

(57)  ABSTRACT

A semiconductor structure and a method for forming a semiconductor structure are provided. The semiconductor structure includes: a substrate; a laminate structure arranged on the substrate and including first semiconductor layers spaced apart from each other in a direction perpendicular to a top surface of the substrate, each first semiconductor layer including channel areas spaced apart from each other in a first direction, and first doped areas and second doped areas, each first doped area being arranged on one side of a respective one of the channel areas in a second direction, each second doped area being arranged on another side of the respective one of the channel areas in the second direction; and a word line structure including word lines extending in the first direction, an edge of each word line being flush with an edge of a respective one of the channel areas in the second direction.

17 Claims, 23 Drawing Sheets

(58) Field of Classification Search
CPC .... H10B 12/312; H10B 12/485; H10B 12/00; H10B 12/01; H01L 28/86; H01L 23/5226; H01L 23/5283; H01L 29/78672; H01L 29/7869; H01L 21/8221; H01L 27/0688; H01L 27/1255; H01L 29/78684; H01L 29/78696; H01L 29/42392; H01L 29/78618; G11C 5/063
See application file for complete search history.

(56) References Cited

U.S. PATENT DOCUMENTS

| | | |
|---|---|---|
| 2021/0408048 A1 | 12/2021 | Wang |
| 2022/0005809 A1 | 1/2022 | Kim et al. |
| 2022/0045064 A1 | 2/2022 | Jung |
| 2022/0115378 A1 | 4/2022 | Lee |
| 2022/0122976 A1 | 4/2022 | Kim |

FOREIGN PATENT DOCUMENTS

| | | |
|---|---|---|
| CN | 114023744 A | 2/2022 |
| CN | 114068568 A | 2/2022 |
| CN | 114121819 A | 3/2022 |
| CN | 114373735 A | 4/2022 |
| EP | 3826058 A1 | 5/2021 |

* cited by examiner

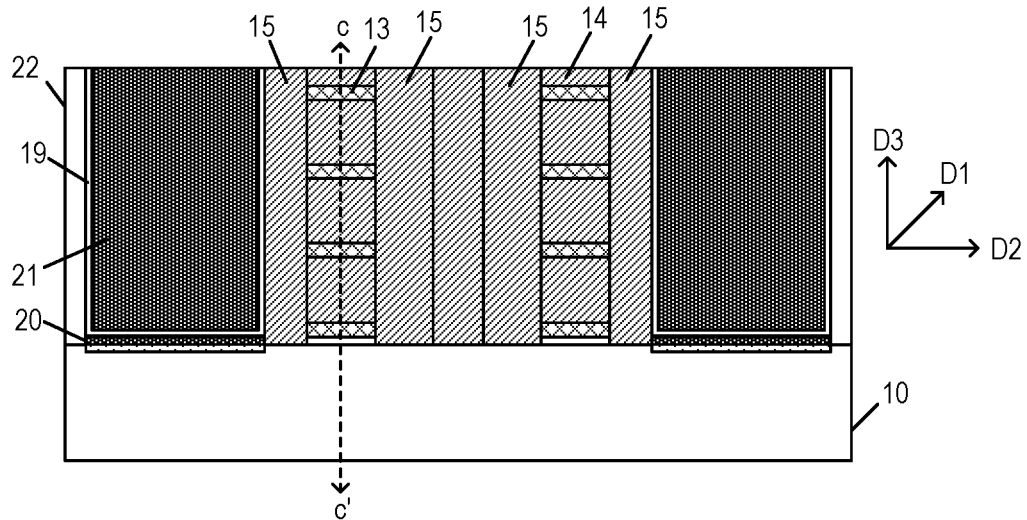

FIG. 3

| A substrate and a stack layer arranged on the substrate are formed, in which the stack layer includes a plurality of first semiconductor layers and a plurality of second semiconductor layers alternately stacked on one another in a direction perpendicular to a top surface of the substrate, each of the plurality of first semiconductor layers includes a plurality of channel areas spaced apart from each other in a first direction, and a plurality of first doped areas and a plurality of second doped areas, each of the plurality of first doped areas being arranged on one side of a respective one of the plurality of channel areas in a second direction, and each of the plurality of second doped areas being arranged on another side of the respective one of the plurality of channel areas in the second direction, each of the first direction and the second direction is a direction parallel to the top surface of the substrate, and the first direction intersects with the second direction | S41 |
|---|---|
| A plurality of first openings respectively exposing the plurality of channel areas are formed | S42 |
| A word line structure is directly formed in each of the plurality of first openings, in which the word line structure includes a plurality of word lines extending in the first direction, and each of the plurality of word lines continuously covers the plurality of channel areas spaced apart from each other | S43 |

FIG. 4

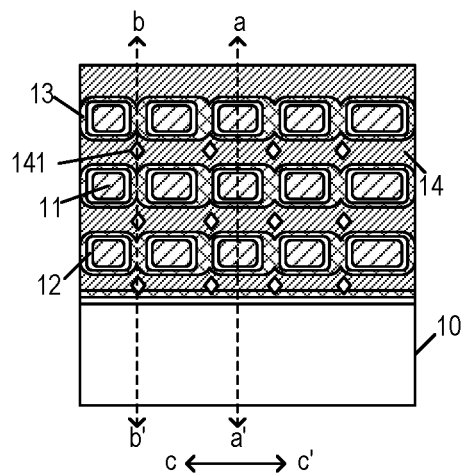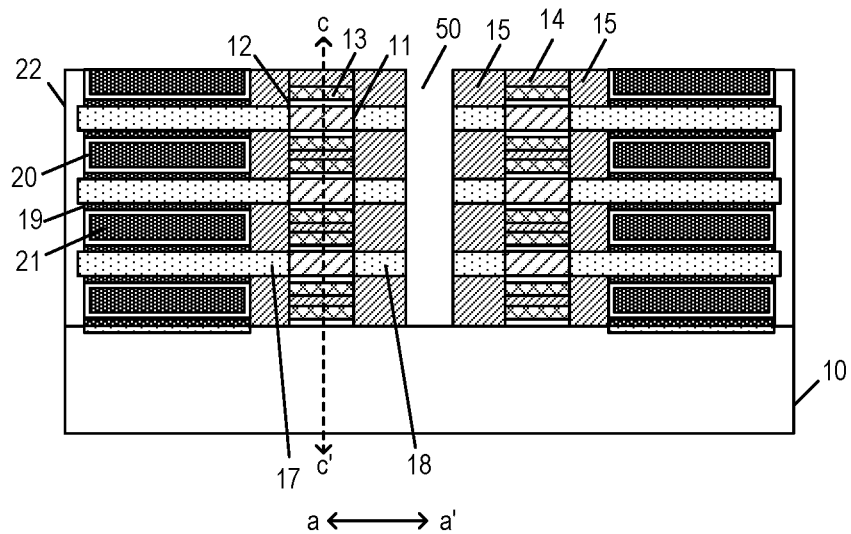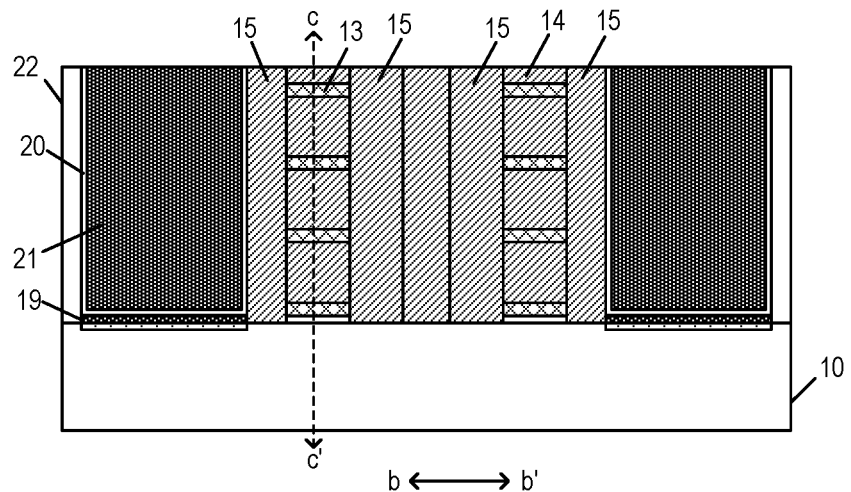
FIG. 5T

SEMICONDUCTOR STRUCTURE AND METHOD FOR FORMING SEMICONDUCTOR STRUCTURE

CROSS-REFERENCE TO RELATED APPLICATIONS

This is a continuation application of International Patent Application No. PCT/CN2022/095920, filed on May 30, 2022, which claims priority to Chinese Patent Application No. 202210419984.1, filed on Apr. 21, 2022 and entitled "SEMICONDUCTOR STRUCTURE AND METHOD FOR FORMING SEMICONDUCTOR STRUCTURE". The disclosures of International Patent Application No. PCT/CN2022/095920 and Chinese Patent Application No. 202210419984.1 are incorporated by reference herein in their entireties.

BACKGROUND

A Dynamic Random Access Memory (DRAM) is a semiconductor device commonly used in an electronic device such as a computer, and is composed of multiple storage cells. Each storage cell generally includes a transistor and a capacitor. A gate of the transistor is electrically connected to a word line, a source of the transistor is electrically connected to a bit line, and a drain of the transistor is electrically connected to the capacitor. A word line voltage on the word line can control turning on and turning off of the transistor, so that data information stored in the capacitor can be read through the bit line, or data information can be written into the capacitor through the bit line.

As a dimension of a memory structure such as the DRAM is continuously reduced, great challenges are brought to the manufacturing process and the manufacturing yield of a three-dimensional memory. For example, as the dimension of the memory structure such as the DRAM is reduced, the internal resistance of the memory may be excessively high due to a vertical word line structure, thereby affecting the electrical performance of the memory.

Therefore, at present, an urgent technical problem to be solved is how to improve the structure of the memory to adapt to the memory with a continuously reduced dimension.

SUMMARY

The disclosure relates to the technical field of semiconductor manufacturing, in particular to a semiconductor structure and a method for forming a semiconductor structure.

Some embodiments of the disclosure provide a semiconductor structure and a method for forming a semiconductor structure, so as to adapt to requirements of the semiconductor structure with a continuously reduced dimension to improve the performance of the semiconductor structure, while simplifying the manufacturing process of the semiconductor structure.

According to some embodiments, the disclosure provides a semiconductor structure, which includes:
 a substrate;
 a laminate structure arranged on the substrate, in which the laminate structure includes a plurality of first semiconductor layers spaced apart from each other in a direction perpendicular to a top surface of the substrate, in which each of the plurality of first semiconductor layers includes a plurality of channel areas spaced apart from each other in a first direction, and a plurality of first doped areas and a plurality of second doped areas, each of the plurality of first doped areas being arranged on one side of a respective one of the plurality of channel areas in a second direction, and each of the plurality of second doped areas being arranged on another side of the respective one of the plurality of channel areas in the second direction, and in which each of the first direction and the second direction is a direction parallel to the top surface of the substrate, and the first direction intersects with the second direction; and
 a word line structure, in which the word line structure includes a plurality of word lines extending in the first direction, and an edge of each of the plurality of word lines is flush with an edge of a respective one of the plurality of channel areas in the second direction.

According to other embodiments, the disclosure also provides a method for forming a semiconductor structure, which includes the following operations.

A substrate and a stack layer arranged on the substrate are formed. The stack layer includes a plurality of first semiconductor layers and a plurality of second semiconductor layers alternately stacked on one another in a direction perpendicular to a top surface of the substrate. Each of the plurality of first semiconductor layers includes a plurality of channel areas spaced apart from each other in a first direction, and a plurality of first doped areas and a plurality of second doped areas. Each of the plurality of first doped areas is arranged on one side of a respective one of the plurality of channel areas in a second direction, and each of the plurality of second doped areas is arranged on another side of the respective one of the plurality of channel areas in the second direction. Each of the first direction and the second direction is a direction parallel to the top surface of the substrate, and the first direction intersects with the second direction.

A plurality of first openings respectively exposing the plurality of channel areas are formed.

A word line structure is directly formed in each of the plurality of first openings. The word line structure includes a plurality of word lines extending in the first direction. Each of the plurality of word lines continuously covers the plurality of channel areas spaced apart from each other.

BRIEF DESCRIPTION OF THE DRAWINGS

FIG. 3 is a schematic cross-sectional view taken along a b-b' position in FIG. 1;

FIG. 4 is a flowchart of a method for forming a semiconductor structure according to a specific implementation of the disclosure.

DETAILED DESCRIPTION

The specific implementations of a semiconductor structure and a method for forming a semiconductor structure provided in the disclosure will be described in detail below with reference to the accompanying drawings.

Figure 1:
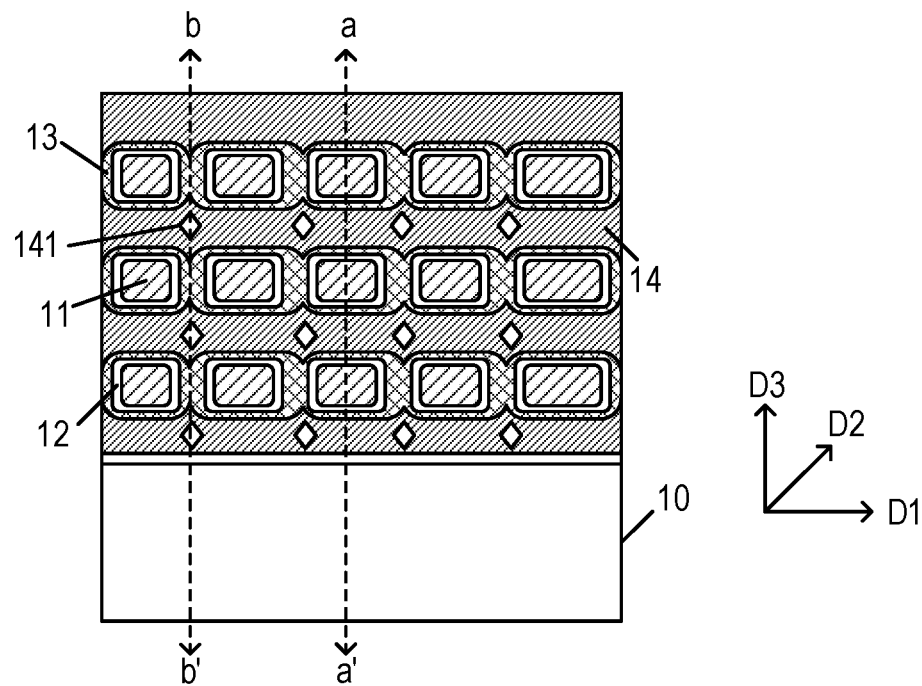
FIG. 1 is a schematic cross-sectional view of a semiconductor structure according to a specific implementation of the disclosure.
Figure 2:
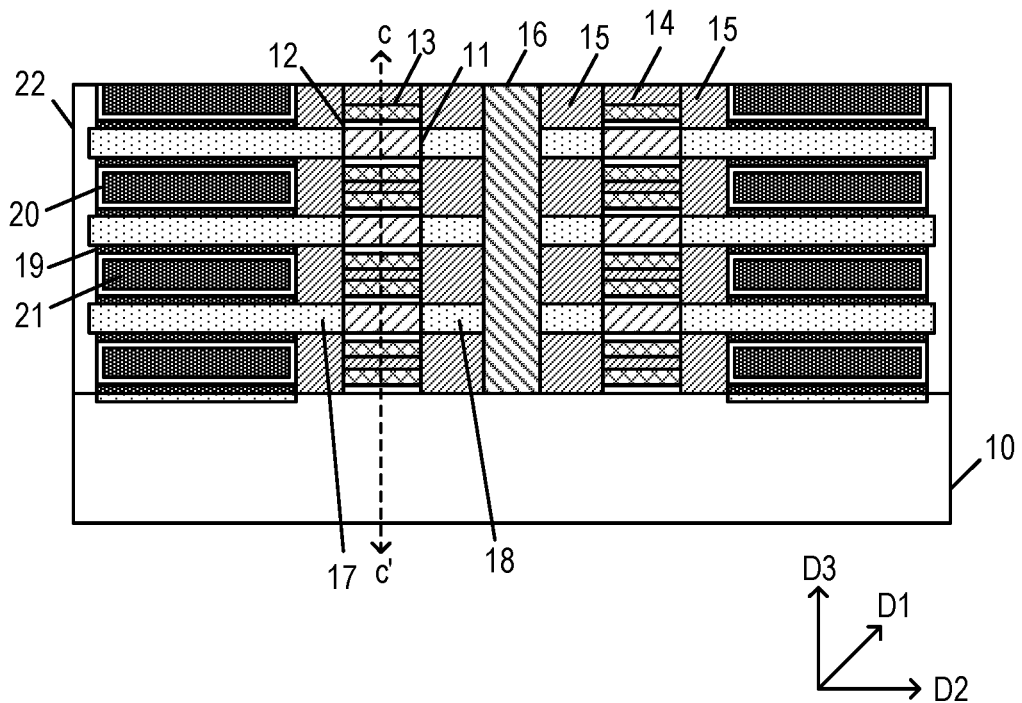
FIG. 2 is a schematic cross-sectional view taken along a a-a' position in FIG. 1.

This specific implementation provides a semiconductor structure. FIG. 1 is a schematic cross-sectional view of a semiconductor structure according to a specific implementation of the disclosure. FIG. 2 is a schematic cross-sectional view taken along a a-a' position in FIG. 1. FIG. 3 is a schematic cross-sectional view taken along a b-b' position in FIG. 1. FIG. 1 is a schematic cross-sectional view taken along a c-c' position in FIG. 2 and FIG. 3. The semiconductor structure in this specific implementation may be, but is not limited to, a DRAM. As shown in FIG. 1 to FIG. 3, the semiconductor structure provided in this specific implementation includes:

a substrate 10;
a laminate structure arranged on the substrate 10, in which the laminate structure includes a plurality of first semiconductor layers spaced apart from each other in a direction perpendicular to a top surface of the substrate 10, in which each of the plurality of first semiconductor layers includes a plurality of channel areas 11 spaced apart from each other in a first direction D1, and a plurality of first doped areas 17 and a second doped areas 18, each of the plurality of first doped areas being arranged on one side of a respective one of the plurality of channel areas 11 in a second direction D2, and each of the plurality of second doped areas being arranged on another side of the respective one of the plurality of channel areas 11 in the second direction D2, and in which each of the first direction D1 and the second direction D2 is a direction parallel to the top surface of the substrate 10, and the first direction D1 intersects with the second direction D2;
a word line structure, in which the word line structure includes a plurality of word lines 13 extending in the first direction D1, and an edge of each of the plurality of word lines 13 is flush with an edge of a respective one of the plurality of channel areas 11 in the second direction D2.

Specifically, the substrate 10 may be, but is not limited to, a silicon substrate. This specific implementation will be described by taking the substrate 10 as a silicon substrate as an example. In other examples, the substrate 10 may be a semiconductor substrate, such as gallium nitride, gallium arsenide, gallium carbide, silicon carbide, or SOL The substrate 10 is configured to support the laminate structure arranged on a top surface of the substrate. The plurality of first semiconductor layers in the laminate structure are spaced apart from each other in the direction perpendicular to the top surface of the substrate (for example, a third direction D3 shown in FIG. 1). Each first semiconductor layer includes a plurality of channel areas 11 spaced apart from each other in the first direction D1, and a plurality of first doped area 17 and a plurality of second doped area 18. Each first doped area is arranged on one side of a respective channel area 11 in the second direction D2, and each second doped area is arranged on another side of the respective channel area 11 in the second direction D2. The word line structure is arranged above the top surface of the substrate 10, and includes a plurality of word lines 13 extending in the first direction D1. Each word line 13 continuously covers the plurality of channel areas 11 spaced apart from each other in the first direction D1 in each first semiconductor layer. An edge of each channel area 11 is flush with an edge of the word line 13 arranged on a surface of the channel area 11 in the second direction D2.

In this specific implementation, by providing the plurality of horizontal word lines (i.e. the plurality of word lines 13 extending in the first direction D1), the plurality of word lines 13 are arranged at different heights, so that the word line structure no longer occupies the top surface of the substrate 10, thereby adapting the requirements of the semiconductor structure with a continuously reduced dimension. When the word line leads for leading out the word lines 13 are formed, the word line leads may be arranged at different heights, which is beneficial to reduce the capacitive coupling effect between the adjacent word line leads and the internal resistance of the semiconductor structure, thereby improving the performance of the semiconductor structure. Moreover, since the horizontal word lines in this specific implementation are formed through a one-step deposition process, an edge of each of the formed word lines 13 is flush with an edge of each of the channel areas 11. Thus, no additional etching process is required after the deposition process, thereby simplifying the formation process of the semiconductor structure, and reducing the manufacturing cost of the semiconductor structure.

In some embodiments, a distance between any two channel areas 11 which are arranged adjacent to each other in the first direction D1 is less than a distance between any two channel areas 11 which are arranged adjacent to each other in the direction perpendicular to the top surface of the substrate 10.

Specifically, the distance between any two channel areas 11 which are arranged adjacent to each other in the first direction D1 is less than the distance between any two channel areas 11 which are arranged adjacent to each other in the direction perpendicular to the top surface of the substrate 10, so that when a conductive material is deposited to form the word lines 13, the conductive material in a horizontal direction are firstly connected to form a line in the first direction D1, so as to directly form the word lines 13 extending only in the first direction D1 by controlling the conditions such as deposition parameters, which is beneficial to further simplify of the formation process of the word lines 13.

In some embodiments, each word line 13 continuously covers the plurality of channel areas 11 arranged in the first direction D1. A medium layer 12 is provided between a respective one of the plurality of word lines 13 and a respective one of the plurality of channel areas 11.

The medium layer 12 covers a surface of the respective one of the plurality of channel areas 11, the respective one of the plurality of word lines 13 covers a surface of the medium layer 12, and an edge of the medium layer 12 is flush with the edge of the respective one of the plurality of word lines 13 in the direction perpendicular to the top surface of the substrate 10.

Specifically, the medium layer 12 is arranged between the channel area 11 and the word line 13. In an example, a material of the first semiconductor layer may be silicon. A material of the medium layer 12 may be silicon dioxide, and the medium layer 12 may be formed by in-situ oxidizing the surface of the first semiconductor layer, thereby further simplifying the manufacturing process of the semiconductor structure.

In some embodiments, the laminate structure further includes a plurality of capacitor structures. Each of the plurality of capacitor structures includes a first electrode layer 19, a dielectric layer 20 and a second electrode layer 21 which are sequentially arranged around a surface of a respective one of the plurality of first semiconductor layers. Each of the plurality of capacitor structures is arranged adjacent to and is electrically connected to a respective one of the plurality of first doped areas 17. The respective one of the plurality of first semiconductor layers around which each of the plurality of capacitor structures is arranged is doped with same ions as each of the plurality of first semiconductor layers corresponding to the respective one of the plurality of first doped areas 17.

Specifically, the top surface of the substrate 10 further includes a capacitor structure adjacent to the first doped areas 17 in the second direction D2. The capacitor structure includes a plurality of capacitors spaced apart from each other in the direction perpendicular to the top surface of the substrate 10. Each capacitor includes a first electrode layer 19, a dielectric layer 20 covering a surface of the first electrode layer 19, and a second electrode layer 21 covering a surface of the dielectric layer 20, which are sequentially arranged around the surface of the first semiconductor layer. The first semiconductor layer is arranged between two adjacent capacitors, and the first semiconductor layer arranged between the adjacent capacitors has the same doped ions as the first doped area 17, so that the first semiconductor layer surrounded by the capacitor structure has conductivity. Moreover, the contact resistance between the first semiconductor layer surrounded by the capacitor structure and the first doped area 17 is relatively small, thereby further improving the electrical performance of the semiconductor structure. A material of the first electrode layer 19 may be the same as a material of the second electrode layer 21, which for example may be metal materials such as tungsten, or may be TiN. A material of the dielectric layer 20 may be a material with a relatively high dielectric constant.

In some embodiments, the laminate structure further includes a bit line structure adjacent to the plurality of second doped areas 18. The bit line structure includes at least one bit line 16 extending in the direction perpendicular to the top surface of the substrate 10. In the direction perpendicular to the top surface of the substrate 10, one bit line 16 is electrically connected to the plurality of second doped areas 18 spaced apart from each other in the direction perpendicular to the top surface of the substrate 10.

Specifically, the top surface of the substrate 10 further includes a bit line structure adjacent to the second doped areas 18 in the second direction D2. The bit line structure includes at least one bit line 16 extending in the direction perpendicular to the top surface of the substrate 10. In the direction perpendicular to the top surface of the substrate 10, one bit line is in direct electrical contact with the plurality of second doped areas 18 spaced apart from each other in the direction perpendicular to the top surface of the substrate 10.

In some embodiments, the laminate structure further includes a first filling layer 14 and a second filling layer 15. The first filling layer 14 is arranged between any two adjacent word lines 13. The second filling layer 15 is arranged between any two adjacent first doped areas 17 and between any two adjacent second doped areas 18.

In some embodiments, the plurality of word lines 13 are spaced apart from each other in the direction perpendicular to the top surface of the substrate 10.

The semiconductor structure further includes a plurality of air gaps 141 arranged in the first filling layer 14 and arranged at least between any two word lines 13 which are arranged adjacent to each other in the direction perpendicular to the top surface of the substrate 10.

Specifically, the first filling layer 14 fills between the adjacent word lines 13 and covers the top surface of the topmost word line 13 in the laminate structure. The second filling layer 15 fills between the adjacent first doped areas 17 and between the adjacent second doped areas 18, and the second filling layer 15 covers the top surface of the topmost first doped area 17 in the laminate structure and the top surface of the topmost second doped area 18 in the laminate structure. In an embodiment, a material of the first filling layer 14 is the same as a material of the second filling layer 15 (for example, silicon dioxide), and the top surface of the first filling layer 14 is flush with the top surface of the second filling layer 15, so as to further simplify the manufacturing process of the semiconductor structure. In addition, the air gaps 141 are provided in the first filling layer 14, which is beneficial to further enhance the electrical isolation effect between the adjacent word lines 13.

In some embodiments, the semiconductor structure further includes at least one support pillar 22.

The support pillar 22 is arranged on the substrate 10 on a side of the capacitor structure away from the plurality of first doped areas 17. The support pillar 22 is connected at least to the laminate structure.

In some embodiments, the plurality of first semiconductor layers in the laminate structure extend into the support pillar 22 in the second direction D2.

In some embodiments, the support pillar 22 extends in the direction perpendicular to the top surface of the substrate 10, and a top surface of the support pillar 22 is flush with a top surface of the laminate structure.

Specifically, at least one support pillar 22 is arranged on the top surface of the substrate 10, extends in the direction perpendicular to the top surface of the substrate 10, and is connected to a side of the capacitor structure away from the first doped areas 17. The support pillar is configured to support the laminate structure to improve the stability of the laminate structure, thereby avoiding the laminate structure from collapsing or tipping during formation of the capacitor structure or other structures. The top surface of the support pillar 22 is flush with the top surface of the laminate structure, so that the support pillar 22 can support the entire laminate structure, which is beneficial to further improve the stability of the top portion of the laminate structure. In another embodiment, the top surface of the support pillar 22 may also be arranged above the top surface of the laminate structure.

Each first semiconductor layer in this specific implementation may further includes a plurality of channel areas 11 spaced apart from each other in the second direction D2, and a plurality of first doped areas 17 and a plurality of second doped areas 18. Each first doped area is arranged on one side of a respective channel area 11 in the second direction D2, and each second doped area is arranged on another side of the respective channel area 11 in the second direction D2. One bit line 16 is arranged between two second doped areas 18 which are arranged adjacent to each other in the second direction D2 and is electrically connected to the two second doped areas 18 which are arranged adjacent to each other in the second direction D2. There are multiple capacitor structures in the laminate structure, and each of the plurality capacitor structures is respectively arranged adjacent to and electrically connected to a respective one of the plurality of first doped areas 17. There may be multiple support pillars 22, and each of the plurality of support pillars is respectively in contact with the plurality of capacitor structures. The plurality of support pillars may be symmetrically distributed around the outer circumference of the laminate structure, so as to further enhance the stability of the laminate structure. In this specific implementation, the expression "a plurality of" may refer to two or more.

Figure 5A:
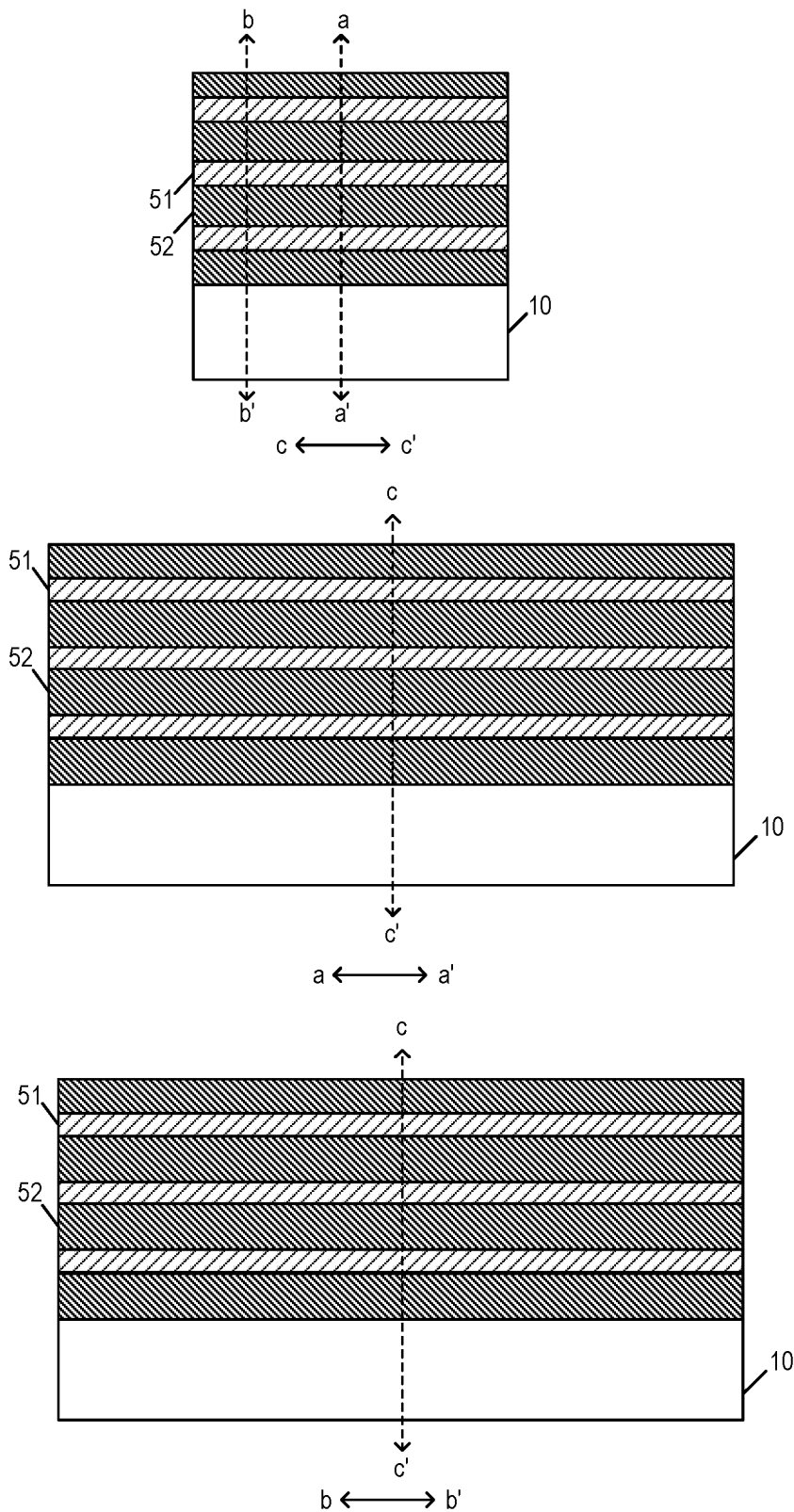
FIG. 5A to FIG. 5U are schematic cross-sectional views of main processes during forming a semiconductor structure according to a specific implementation of the disclosure.
Figure 5B:
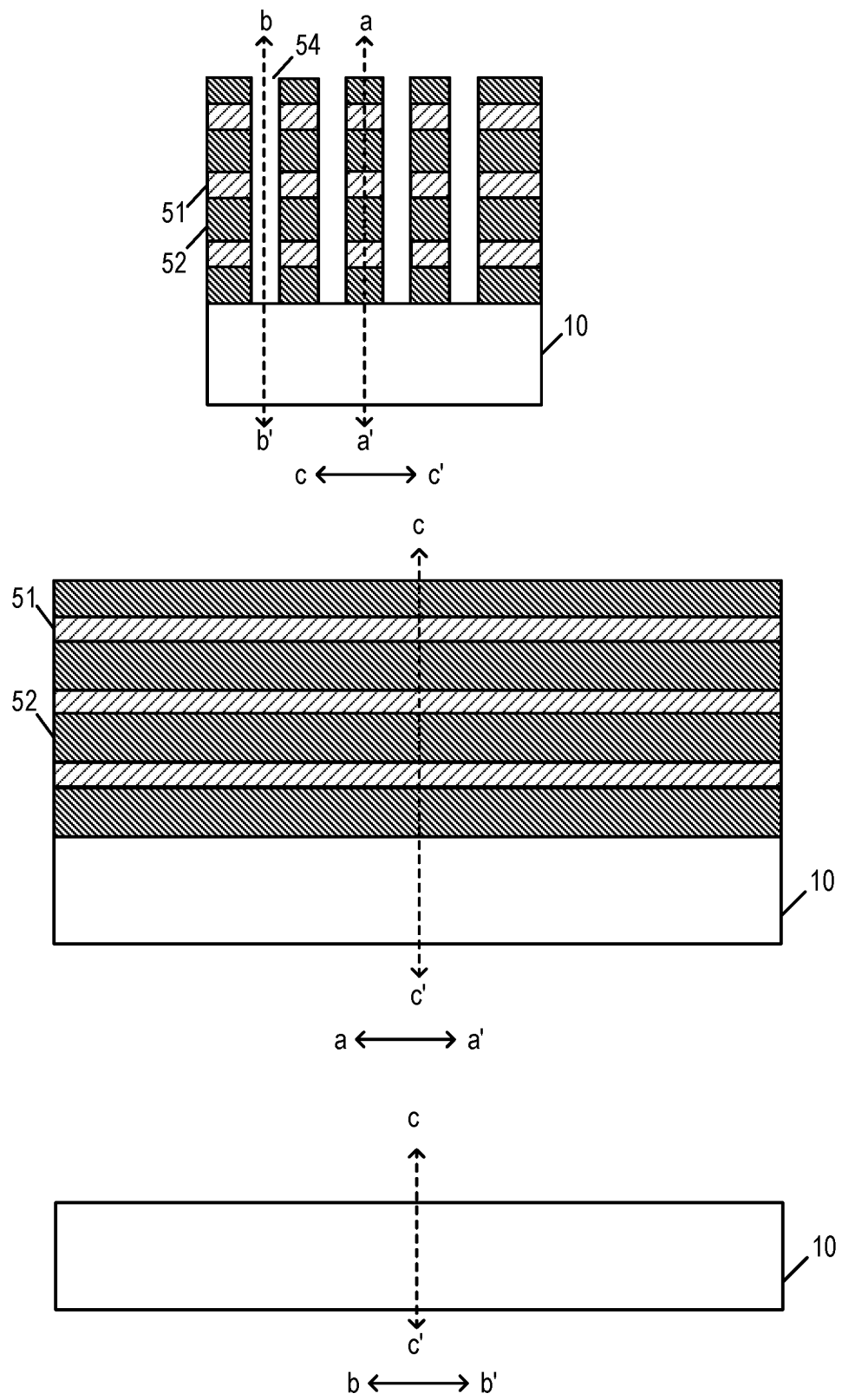
Figure 5C:
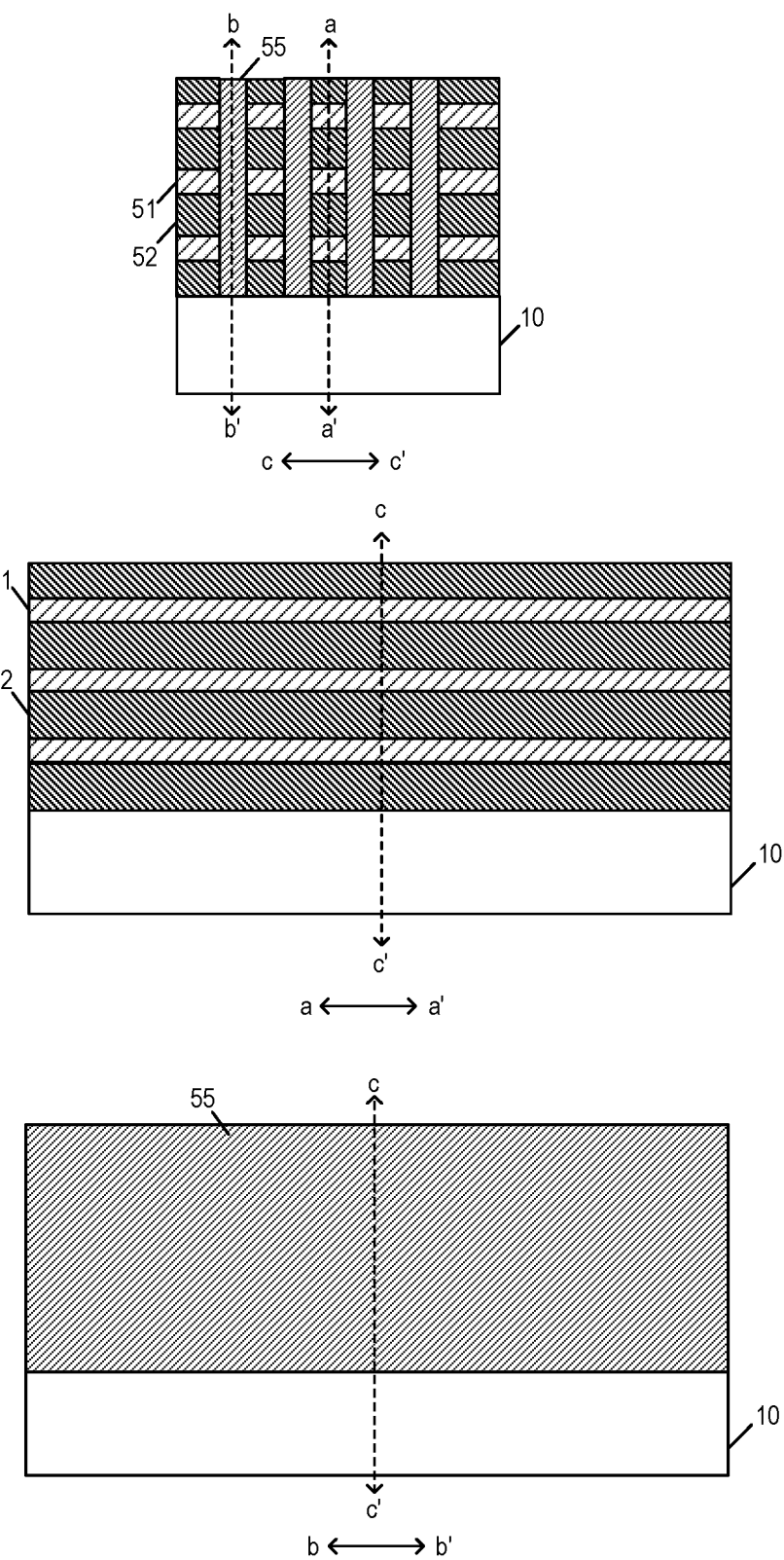
Figure 5D:
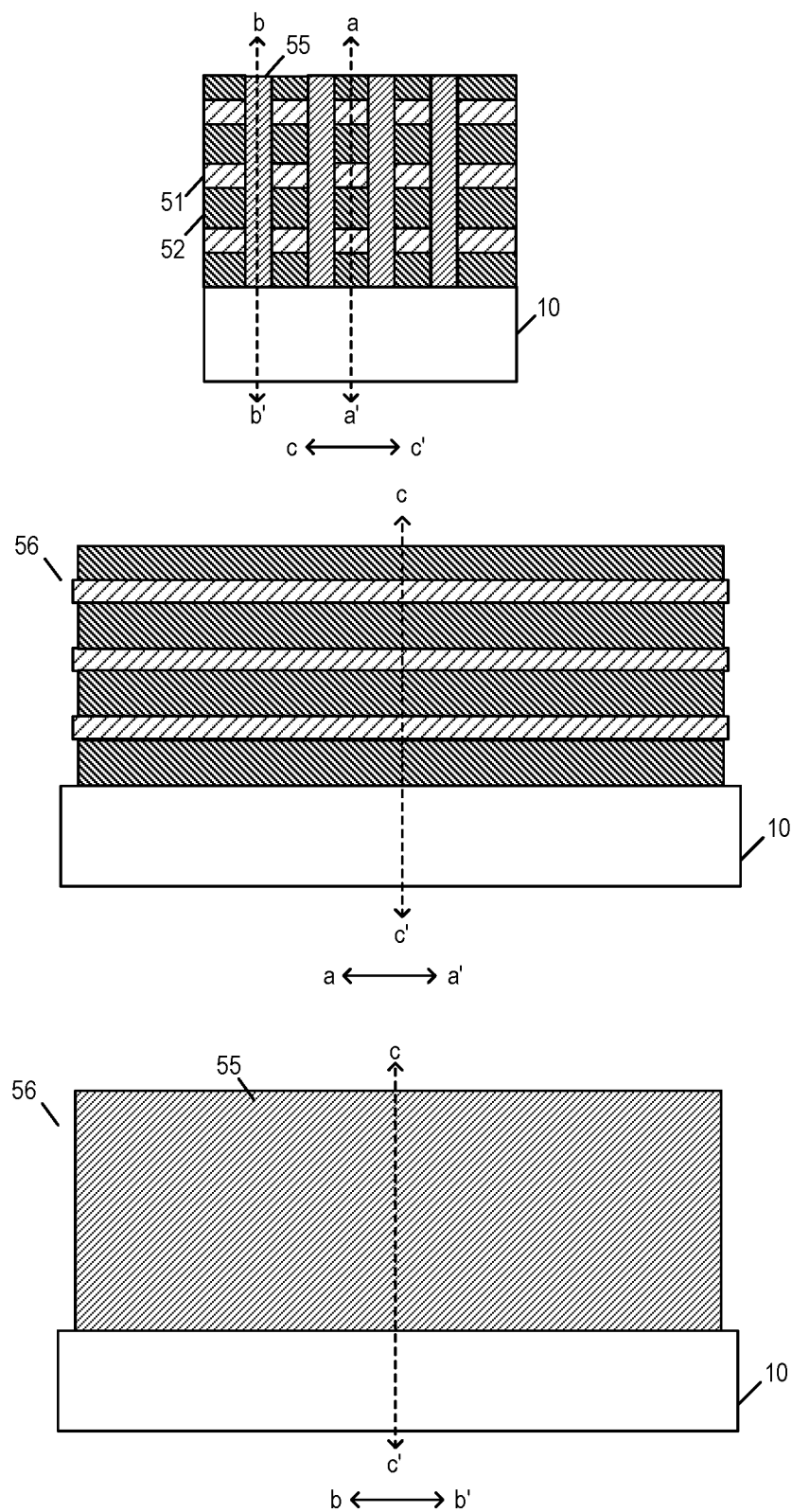
Figure 5E:
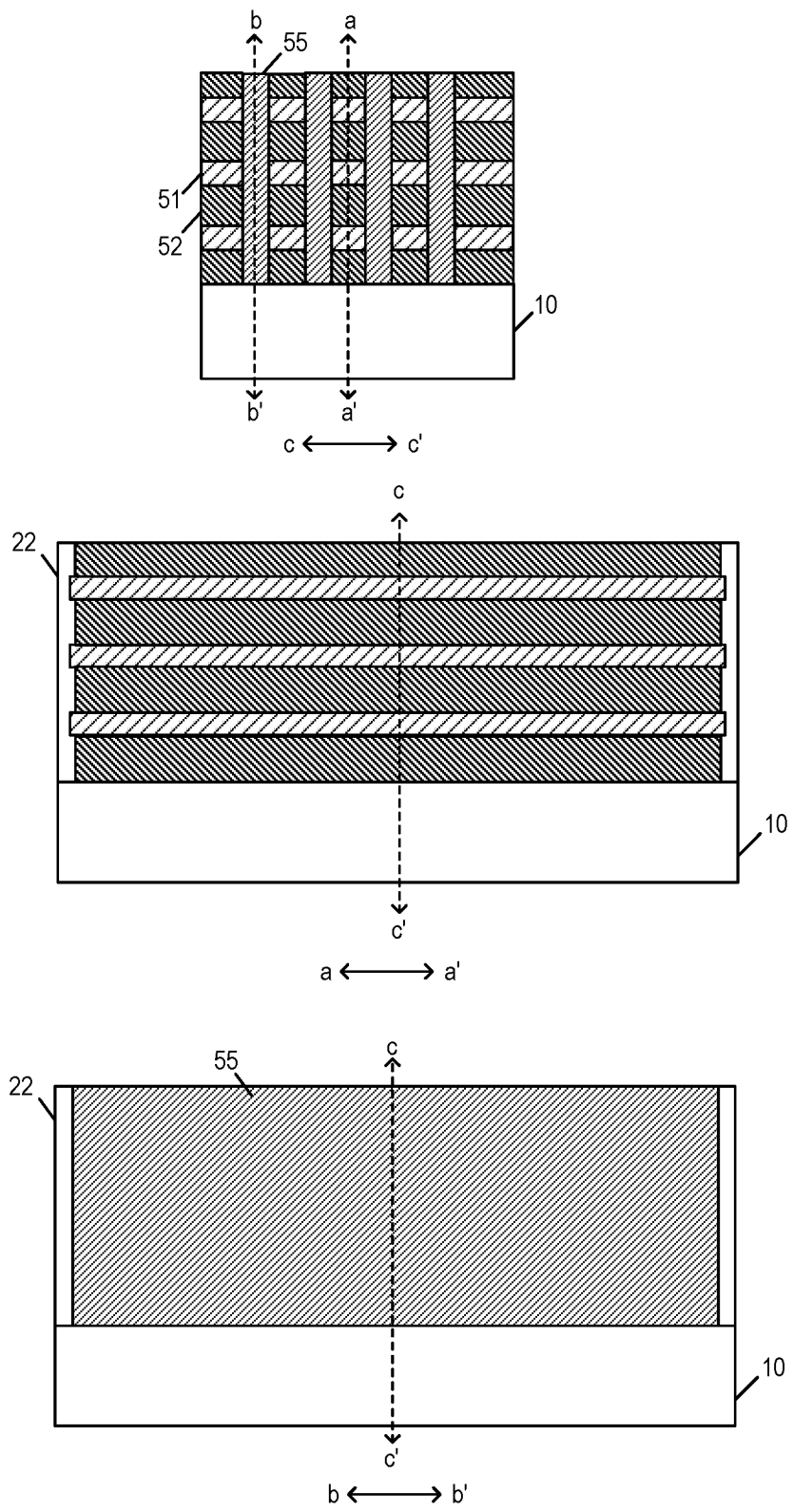
Figure 5F:
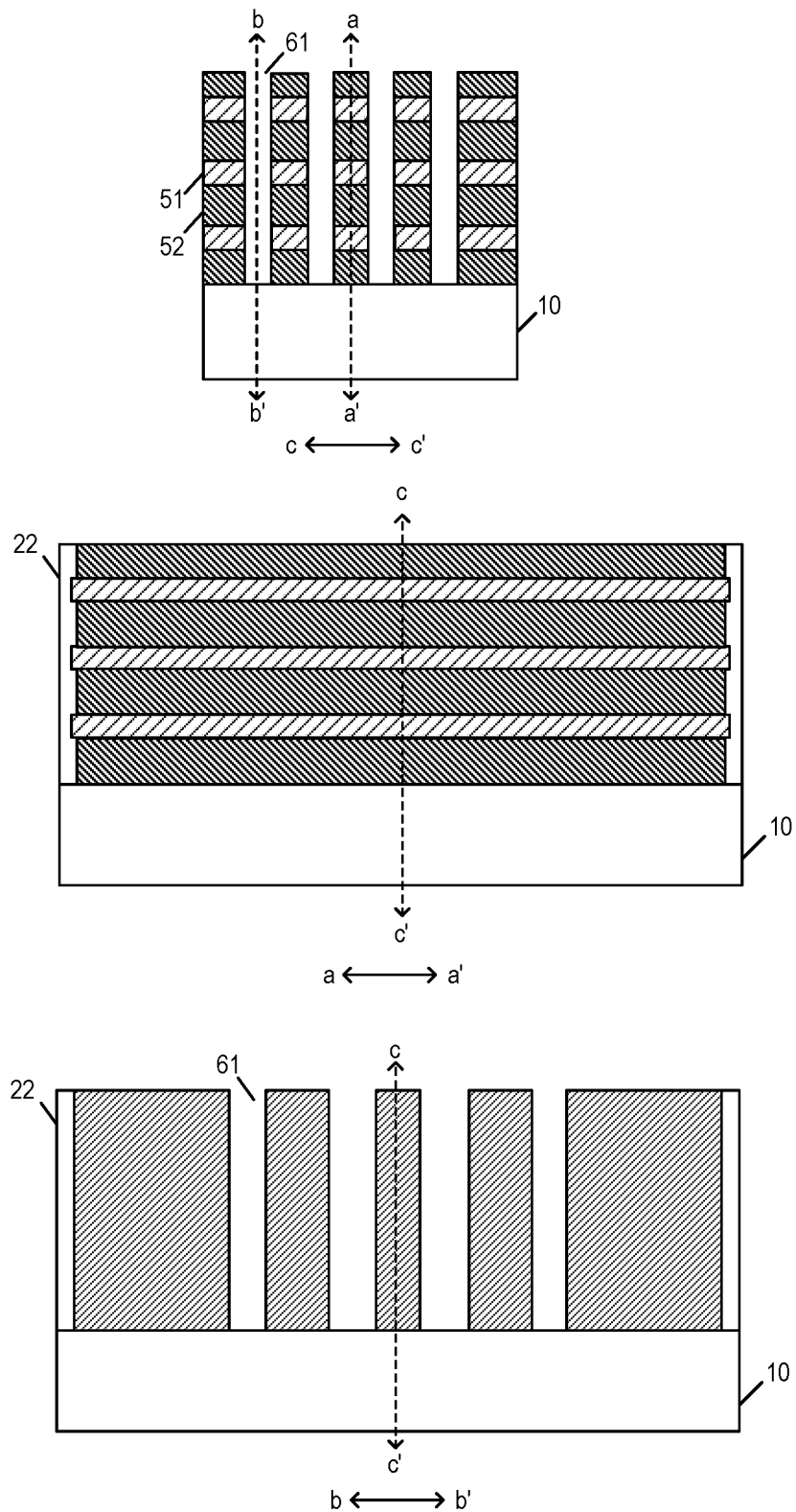
Figure 5G:
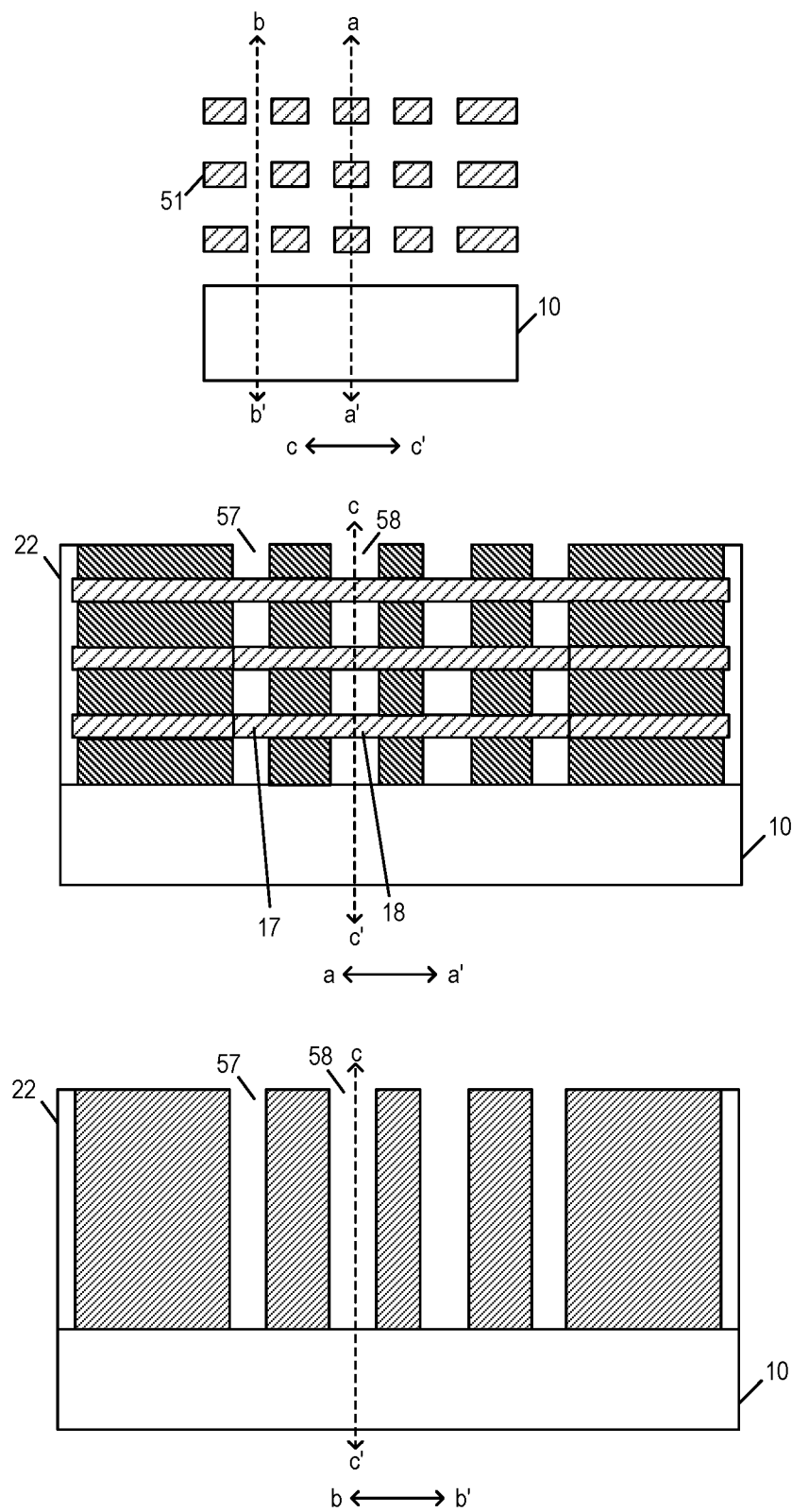
Figure 5H:
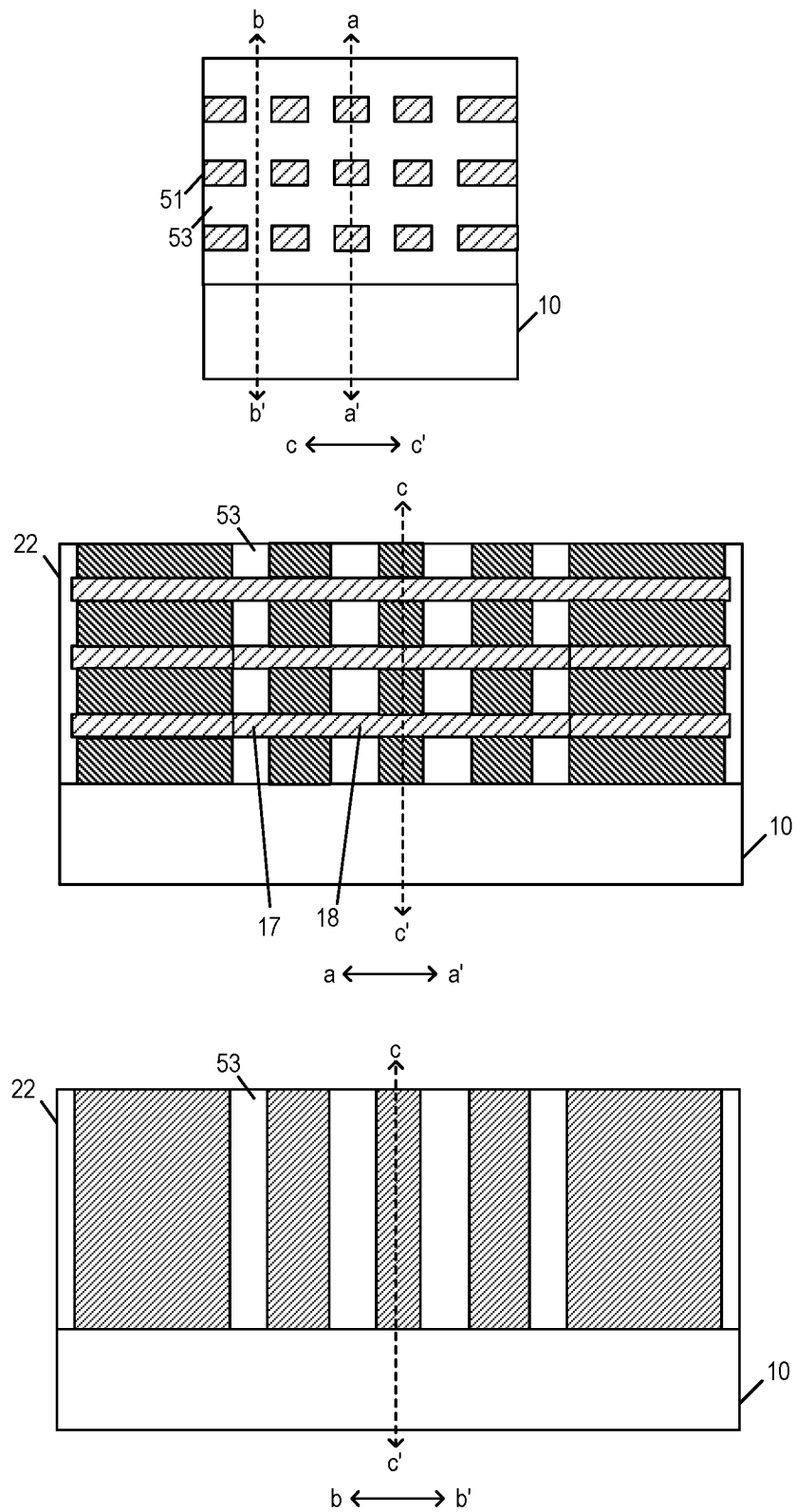
Figure 5I:
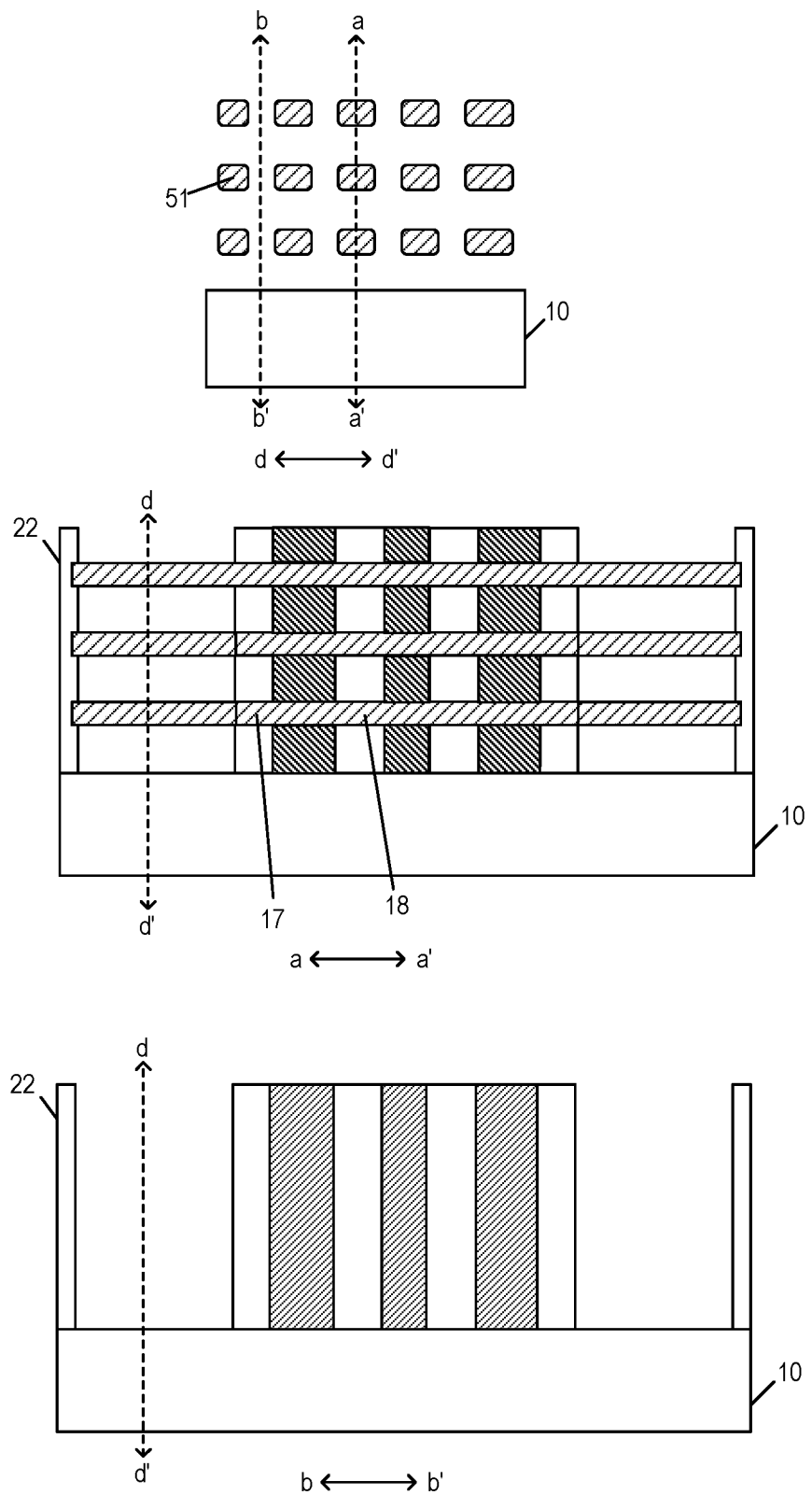
Figure 5J:
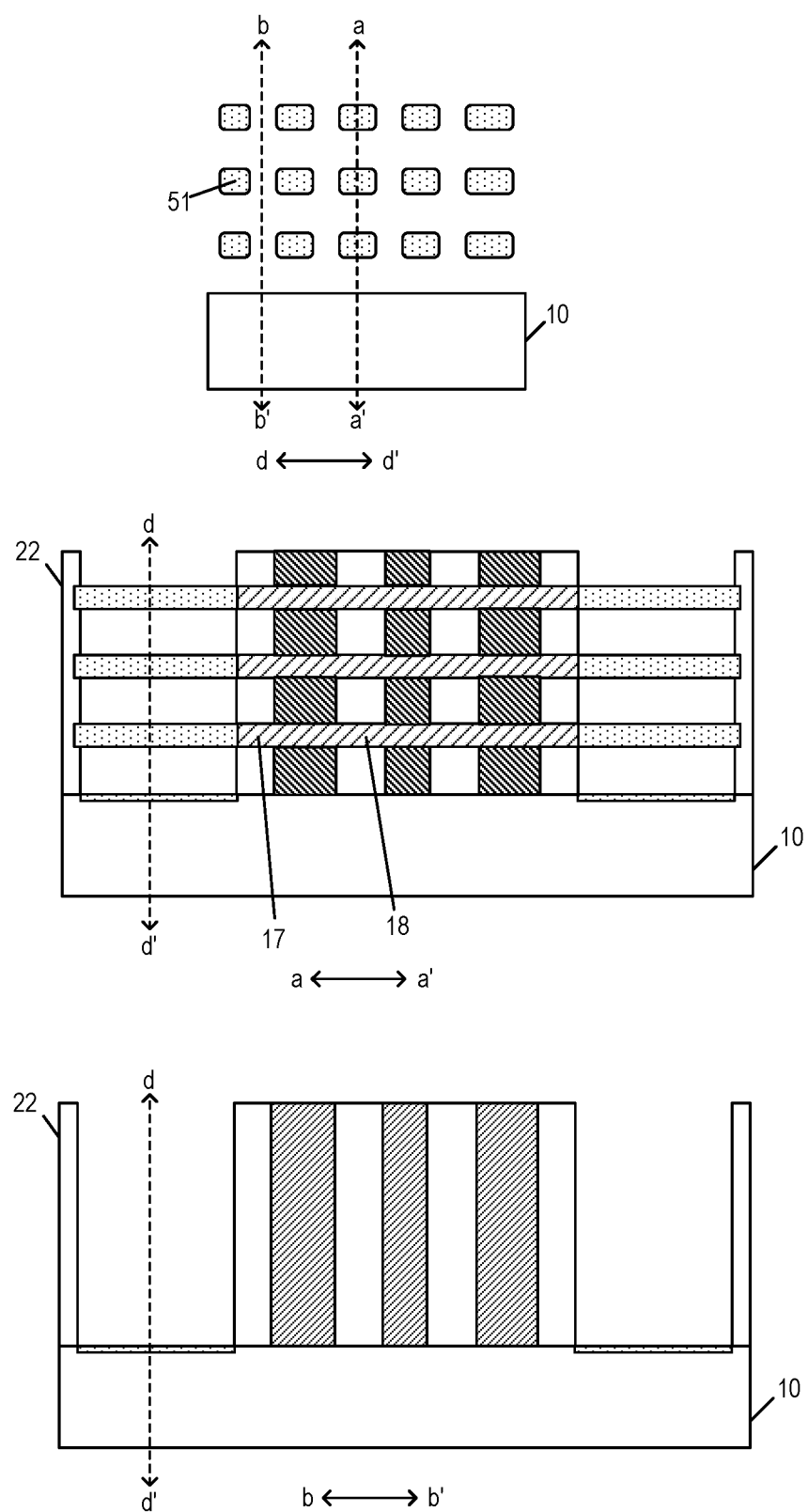
Figure 5K:
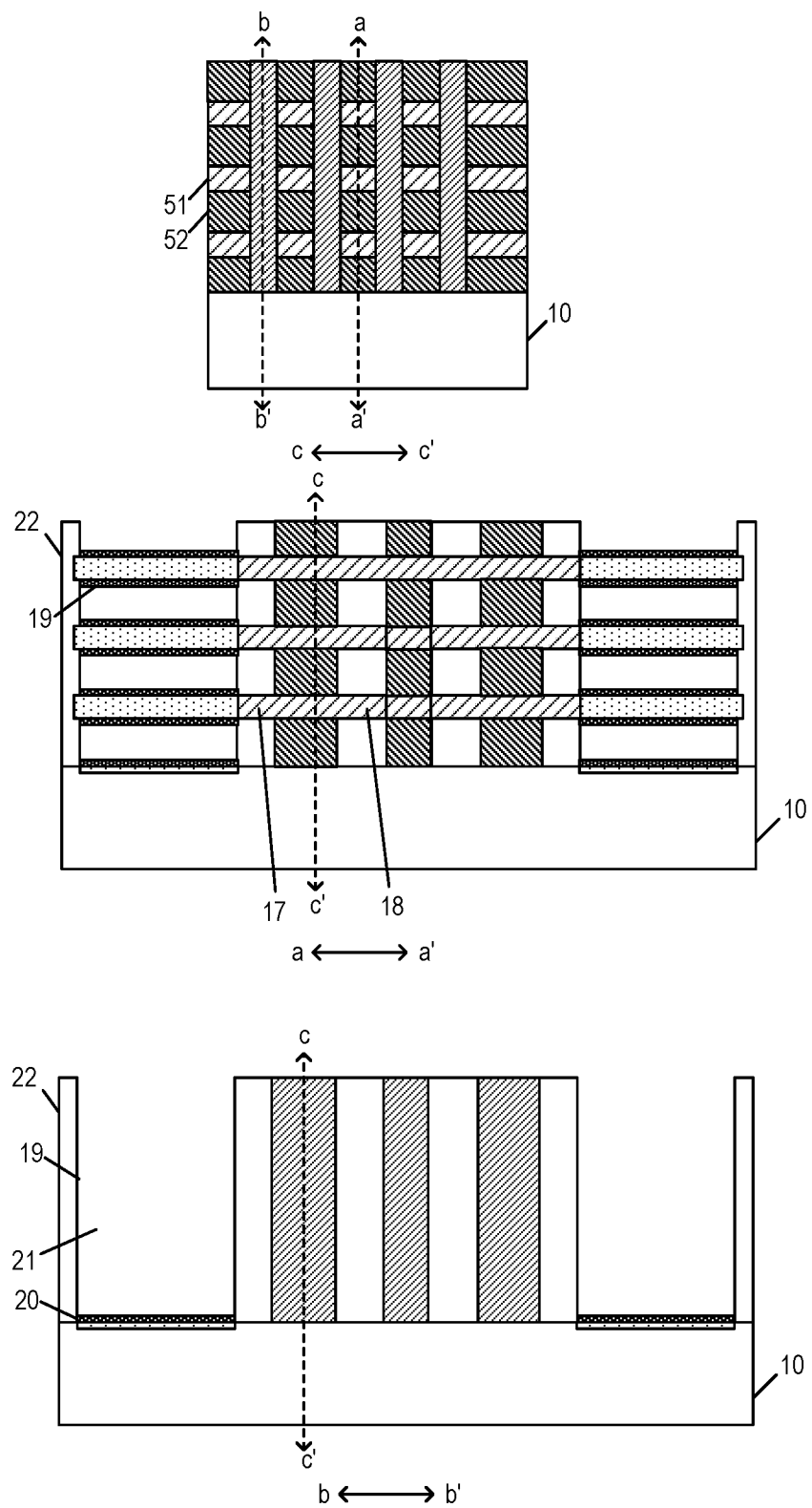
Figure 5L:
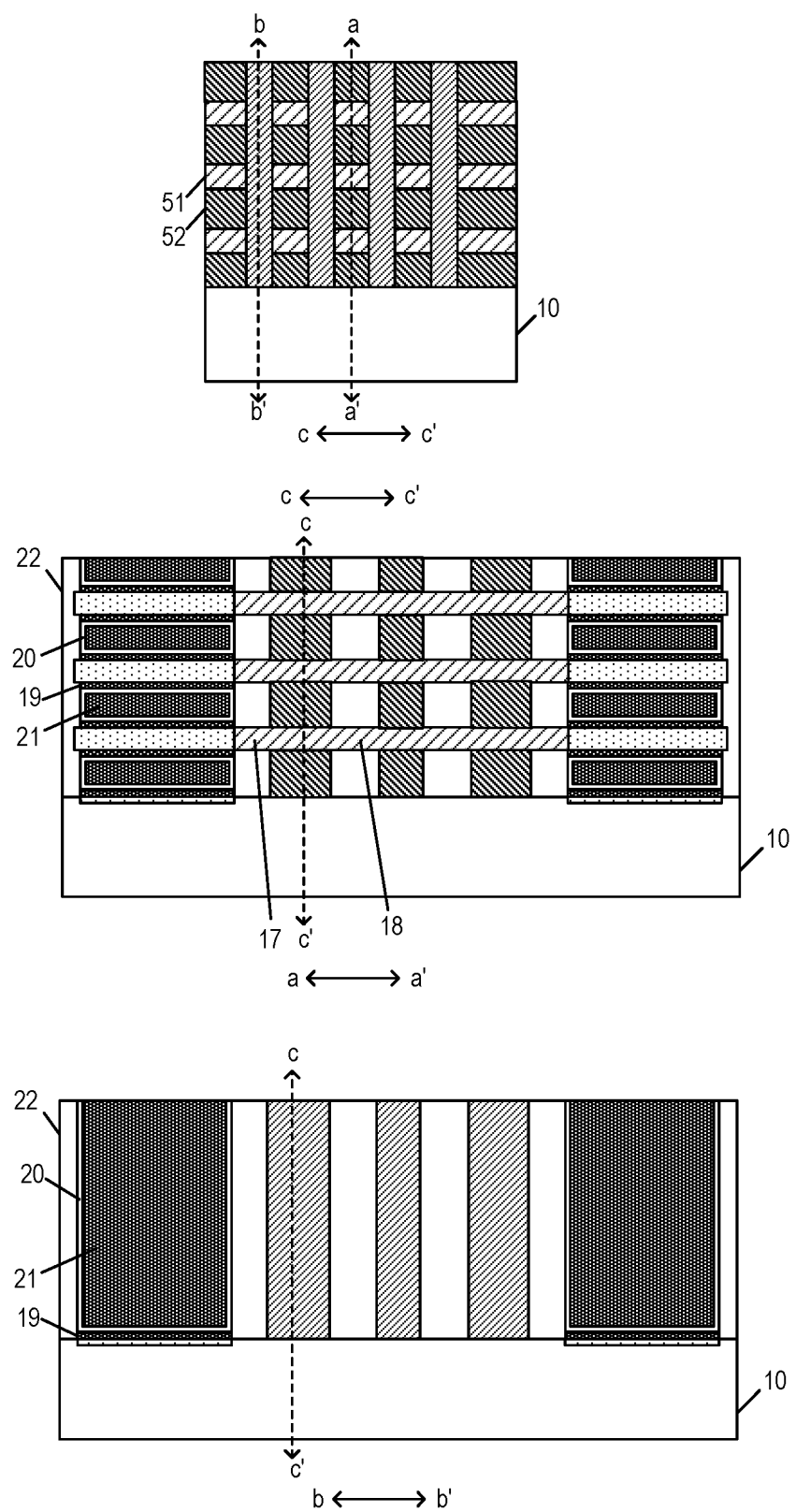

This specific implementation also provides a method for forming a semiconductor structure. FIG. 4 is a flowchart of a method for forming a semiconductor structure according to a specific implementation of the disclosure. FIG. 5A to FIG. 5U are schematic cross-sectional views of main processes during forming a semiconductor structure according to a specific implementation of the disclosure. The schematic view of the semiconductor structure formed in this specific implementation may be shown in FIG. 1 to FIG. 3. FIG. 5A to FIG. 5U show schematic cross-sectional views of processes of a semiconductor structure during formation from four positions of c-c', a-a', b-b', and d-d', so as to clearly describe a method for forming a semiconductor structure. The semiconductor structure in this specific implementation may be, but is not limited to, a DRAM. As shown in FIG. 1 to FIG. 4 and FIG. 5A to FIG. 5U, a method for forming a semiconductor structure includes the following operations.

In S41, a substrate 10 and a stack layer arranged on the substrate 10 are formed. The stack layer includes a plurality of first semiconductor layers 51 and a plurality of second semiconductor layers 52 alternately stacked on one another in a direction perpendicular to a top surface of the substrate 10. Each of the plurality of first semiconductor layers 51 includes a plurality of channel areas 11 spaced apart from each other in a first direction D1, and a plurality of first doped areas 17 and a plurality of second doped areas 18. Each of the plurality of first doped areas is arranged on one side of a respective one of the plurality of channel areas 11 in a second direction D2, and each of the plurality of second doped areas is arranged on another side of the respective one of the plurality of channel areas 11 in the second direction D2. Each of the first direction D1 and the second direction D2 is a direction parallel to the top surface of the substrate 10, and the first direction D1 intersects with the second direction D2.

Figure 5M:
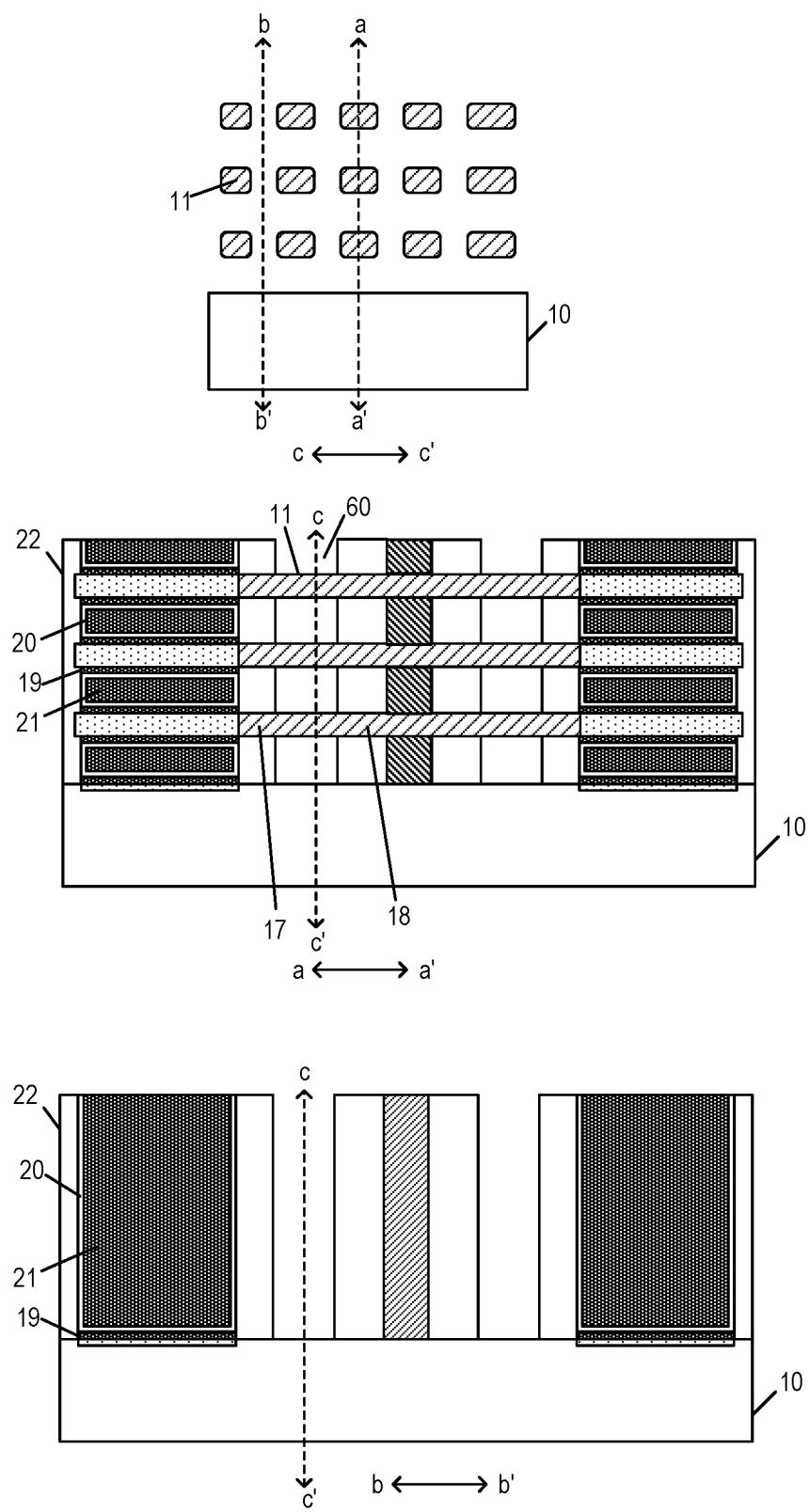

In S42, a plurality of first openings 60 respectively exposing the plurality of channel areas 11 are formed, as shown in FIG. 5M.

In S43, a word line structure is directly formed in each of the plurality of first openings 60. The word line structure includes a plurality of word lines 13 extending in the first direction D1. Each of the plurality of word lines 13 continuously covers the plurality of channel areas 11 spaced apart from each other, as shown in FIG. 5O.

Specifically, the plurality of first semiconductor layers 51 and the plurality of second semiconductor layers 52 may be alternately deposited on the top surface of the substrate 10 in the direction perpendicular to the top surface of the substrate 10 through a chemical vapor deposition process, a physical vapor deposition process, or an atomic layer deposition process, as shown in FIG. 5A, so as to form a stack layer with a super lattice stack structure, thereby further increasing the storage density of the semiconductor structure. The specific number of layers of the first semiconductor layers 51 and the second semiconductor layers 52 alternately stacked on one another in the stack layer may be selected by those skilled in the art according to actual needs. The greater the number of layers of the first semiconductor layers 51 and the second semiconductor layers 52 alternately stacked on one another is, the greater the storage capacity of the semiconductor structure is. An etching selectivity ratio of the first semiconductor layer 51 to the second semiconductor layer 52 should be greater (for example, the etching selectivity ratio is greater than 3), so as to facilitate the subsequent removal of the second semiconductor layer 52 by selective etching. In an example, the material of the first semiconductor layer 51 may be Si, and the material of the second semiconductor layer 52 may be SiGe.

In some embodiments, before the operation that the plurality of first openings 60 are formed, the method further includes the following operations.

A first area and a second area external to the first area are defined in the stack layer.

A portion of the stack layer is removed, so as to form a support groove 56 in the second area, as shown in FIG. 5D.

The support groove 56 is filled to form a support pillar 22 connected to the plurality of first semiconductor layers 51 in the first area, as shown in FIG. 5E.

In some embodiments, the operation that the support groove is formed in the second area includes the following operation.

All of the plurality of second semiconductor layers 52 and a portion of the plurality of first semiconductor layers 51 in the second area are removed to form the support groove 56, in which a remaining portion of the plurality of first semiconductor layers 51 extends from the first area into the support groove 56, as shown in FIG. 5D.

Specifically, after the stack layer formed by the first semiconductor layers 51 and the second semiconductor layers 52 alternately stacked on one another is formed, the stack layer may be etched in the direction perpendicular to the top surface of the substrate 10 through a dry etching process to form a first trench 54 exposing the substrate, as shown in FIG. 5B. The first trench 54 is filled with a material such as oxide (for example, silicon dioxide) to form a first isolation structure 55, as shown in FIG. 5C. In an example, the first area may be arranged in a middle region of the top surface of the substrate 10, the second area may be arranged in an edge region of the top surface of the substrate 10, and the second area may be arranged around the outer circumference of the first area. All of the second semiconductor layers 52 and a portion of the first semiconductor layers 51 in the second area may be etched in the direction perpendicular to the top surface of the substrate 10 through a dry etching process to form a support groove 56. The remaining portion of the first semiconductor layers 51 extends from the first area into the support groove 56, as shown in FIG. 5D. Then, a material such as nitride (for example, silicon nitride) may be deposited in the support groove 56 to form a support pillar 22 for supporting the stack layer in the first area, as shown in FIG. 5E. The first semiconductor layers 51 extend into the support pillar 22, so that the support capability of the support pillar 22 for the remaining portion of the stack layer can be further improved, thereby further improving the structural stability of the remaining portion of the stack layer.

In some embodiments, before the plurality of first openings 60 are formed, the method further includes the following operations.

A transistor area, a capacitor area and a bit line area are defined in the first area. The capacitor area is arranged on one side of the transistor area in the second direction D2, and the bit line area is arranged on another side of the transistor area in the second direction D2. The plurality of channel areas, the plurality of first doped areas 17 and the plurality of second doped areas 18 are arranged in the transistor area. The plurality of first doped areas 17 are arranged adjacent to the capacitor area, and the plurality of second doped areas 18 are arranged adjacent to the bit line area.

A second opening 57 exposing the plurality of first doped areas 17 and a third opening 58 exposing the plurality of second doped areas 18 are formed, as shown in FIG. 5G.

A third filling layer 53 completely filling the second opening 57 and the third opening 58 is formed, as shown in FIG. 5H.

Specifically, the first isolation structure 55 is etched to form a second trench 61 in the first isolation structure 55, as shown in FIG. 5F. Then, a portion of the second semiconductor layers 52 may be removed along the second trench 61 through a wet etching process to form a second opening 57 exposing the first doped areas 17 and a third opening 58 exposing the second doped areas 18 in the transistor area of the stack layer, as shown in FIG. 5G. Then, an insulating material such as nitride (for example, silicon nitride) may be deposited in the second opening 57 and the third opening 58 through a chemical vapor deposition process, a physical vapor deposition process, or an atomic layer deposition process to form a third filling layer 53, as shown in FIG. 5H. The third filling layer 53 is configured to protect the first doped areas 17 and the second doped areas 18, so as to avoid damage to the first doped areas 17 and the second doped areas 18 in the subsequent process.

In an embodiment, there may be a plurality of transistor areas, and there may also be a plurality of capacitor areas. The plurality of capacitor areas are respectively arranged adjacent to the plurality of transistor areas, and the plurality of transistor areas may be arranged on the outer circumference of one bit line area (for example, one of two transistor areas is arranged on one side of one bit line area, and the other one of two transistor area is arranged on another side of the bit line area), so as to further increase the storage capacity of the semiconductor structure, while improving the internal space utilization of the semiconductor structure.

In some embodiments, before the plurality of first openings are formed, the method further includes the following operations.

The plurality of second semiconductor layers 52 in the capacitor area are removed to expose the plurality of first semiconductor layers 51 in the capacitor area, as shown in FIG. 5L.

A first electrode layer 19 covering a surface of each of the plurality of first semiconductor layers 51 is formed in the capacitor area, as shown in FIG. 5K.

A dielectric layer 20 covering a surface of the first electrode layer 19 is formed.

A second electrode layer 21 covering a surface of the dielectric layer 20 is formed, as shown in FIG. 5L.

In some embodiments, the operation that the first electrode layer 19 covering the surface of each of the plurality of first semiconductor layers 51 is formed in the capacitor area includes the following operation.

The first electrode layer 19 covering the surface of each of the plurality of first semiconductor layers 51 is formed through a selective atomic layer deposition process.

In some embodiments, before the operation that the first electrode layer 19 covering the surface of each of the plurality of exposed first semiconductor layers 51 is formed in the capacitor area, the method further includes the following operation.

First doped ions are implanted into the plurality of exposed first semiconductor layers 51 in the capacitor area, as shown in FIG. 5J.

Specifically, after the third filling layer 53 is formed, the second semiconductor layers 52 in the capacitor area and the first isolation structure 55 in the capacitor area may be removed through a wet etching process, so as to expose the first semiconductor layers 51 in the capacitor area, so that the structure shown in FIG. 5I is formed. Then, the first doped ions may be implanted into the exposed first semiconductor layers 51 in the capacitor area through gas phase diffusion method, as shown in FIG. 5J, so as to enhance the conductivity of the first semiconductor layers 51 in the capacitor area. Then, a conductive material such as tungsten or TiN may be deposited on the surface of each of the first semiconductor layers 51 doped with the first doped ions through a selective atomic deposition process to form the first electrode layer 19, as shown in FIG. 5K. The first electrode layer 19 may be directly formed on the top surface and the bottom surface of the first semiconductor layer 51 through the selective atomic layer deposition process without depositing the conductive material on the side wall of the support pillar 22 and on the side wall of the third filling layer 53, which is beneficial to further simplify the manufacturing process of the semiconductor structure. Next, a dielectric layer 20 with a relatively high dielectric constant is deposited on the surface of the first electrode layer 19, and a second electrode layer 21 made of a conductive material such as tungsten or TiN is deposited on the surface of the dielectric layer 20, so as to form a capacitor structure. The capacitor structure includes a plurality of capacitors. Each capacitor includes a first electrode layer 19, a dielectric layer 20 and a second electrode layer 21, as shown in FIG. 5L.

In some embodiments, a thickness of each of the plurality of second semiconductor layers 52 is greater than a distance between any two adjacent first openings 60 of the plurality of first openings spaced apart from each other in the first direction D1.

In some embodiments, before the word line structure is directly formed in each of the plurality of first openings 60, the method further includes the following operation.

Figure 5N:
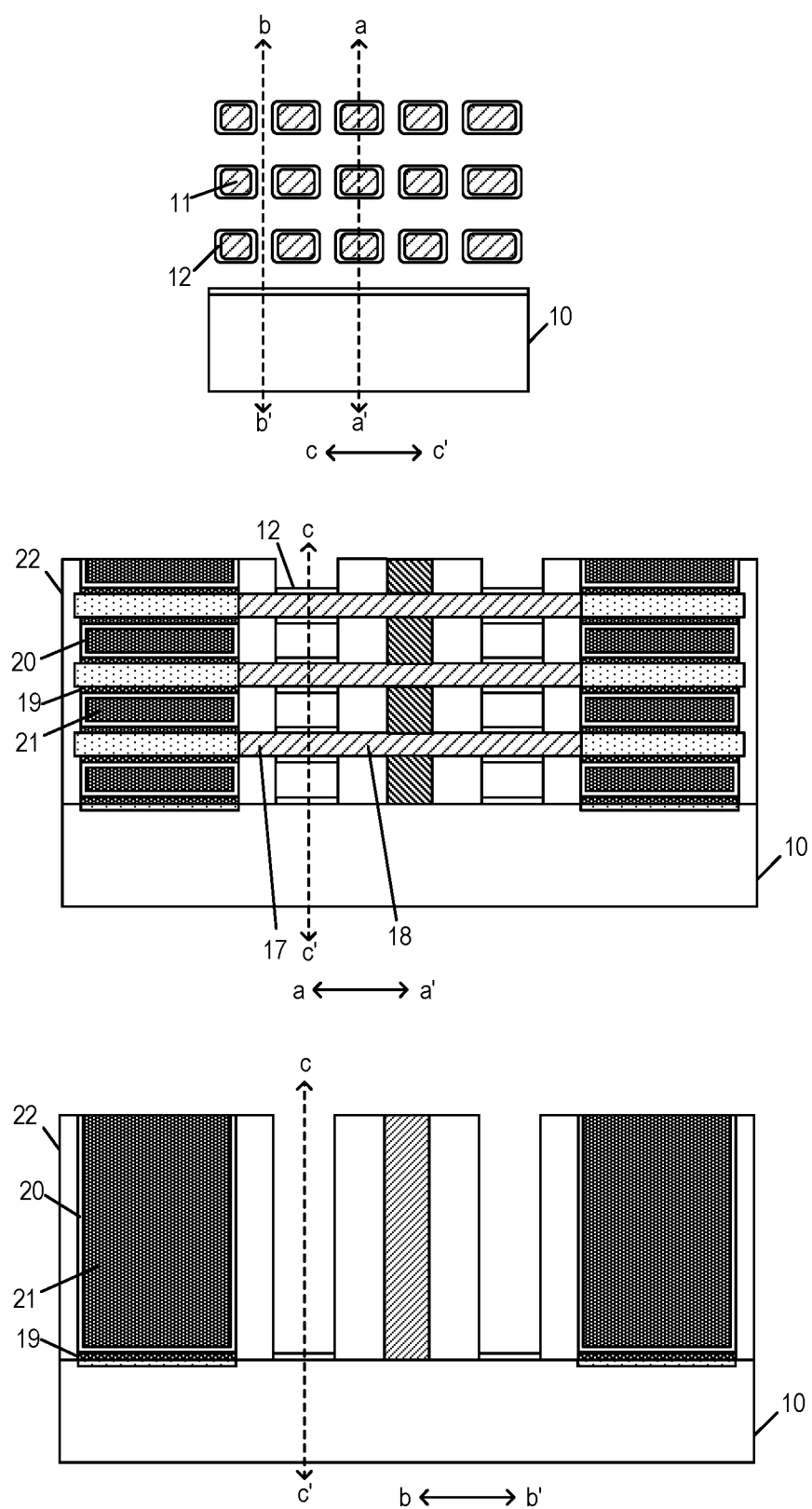
Figure 5O:
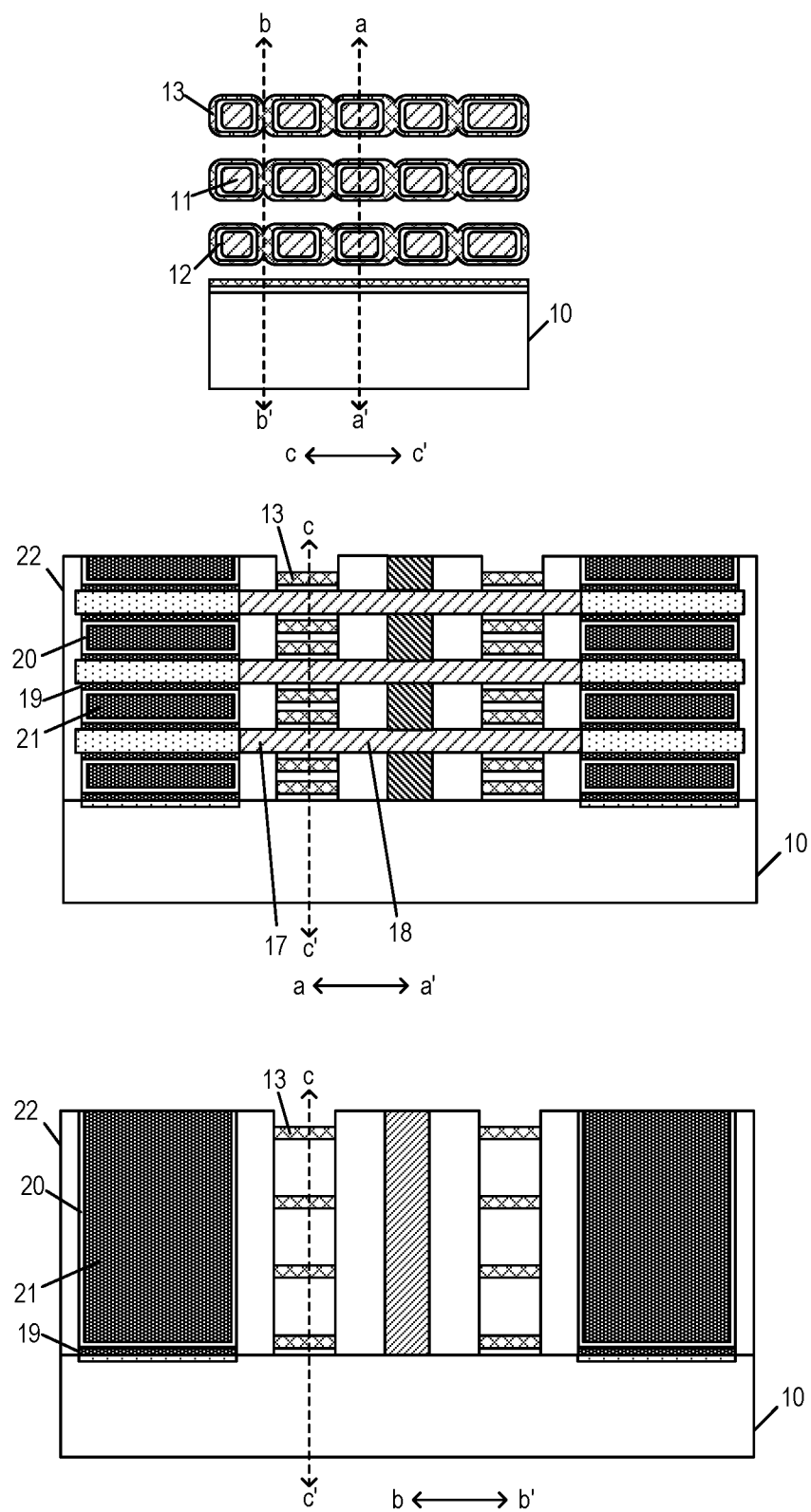

A surface of each of the plurality of channel areas 11 is oxidized through an in-situ oxidation process to form a medium layer 12 on the surface of each of the plurality of channel areas 11, as shown in FIG. 5N.

In some embodiments, the operation that the word line structure is directly formed in each of the plurality of first openings 60 includes the following operation.

A conductive material is deposited in the plurality of first openings 60 through an atomic layer deposition process to directly form the word line structure including the plurality of word lines 13 spaced apart from each other in the direction perpendicular to the top surface of the substrate 10. Each of the plurality of word lines 13 continuously covers the plurality of channel areas 11 spaced apart from each other in the first direction D1.

In some embodiments, an edge of each of the plurality of word lines 13 is flush with an edge of each of the plurality of channel areas 11 in the second direction D2.

Specifically, after the capacitor structure is formed, a portion of the first isolation structure 55 and the second semiconductor layer 52 covering the surface of the channel area 11 may be removed through a wet etching process to form the first opening 60 exposing the channel areas 11, as shown in FIG. 5M. Then, the surface of the channel area 11 is oxidized by thermal oxidation to form a medium layer 12, as shown in FIG. 5N. Since the thickness of the second semiconductor layer 52 is greater than the distance between two adjacent first openings 60 spaced apart from each other in the first direction D1, when the conductive material is deposited in the plurality of first openings 60 through the selective atomic layer deposition process, the conductive material in the plurality of first openings 60 spaced apart from each other in the first direction is firstly connected to form a line (i.e. the word line 13), so as to directly form the word line structure including the plurality of word lines 13 spaced apart from each other in the direction perpendicular to the top surface of the substrate 10. Each word line 13 only continuously covers the plurality of channel areas 11 spaced apart from each other in the first direction D1, as shown in FIG. 5O. The thickness of the second semiconductor layer 52 refers to the width of the second semiconductor layer 52 in the direction perpendicular to the top surface of the substrate 10. Since the word line structure is formed through a one-step deposition process, no additional etching process is required, which is beneficial to simplify the manufacturing process of the semiconductor structure. Moreover, the edge of the word line 13 is flush with the edge of the channel area 11 in the second direction D2, so that the morphology of the word line 13 is better, and the dimensional uniformity among the plurality of word lines 13 is better, so that the electrical performance of the semiconductor structure can be further improved.

In some embodiments, after the word line structure is formed, the method further includes the following operations.

Figure 5P:
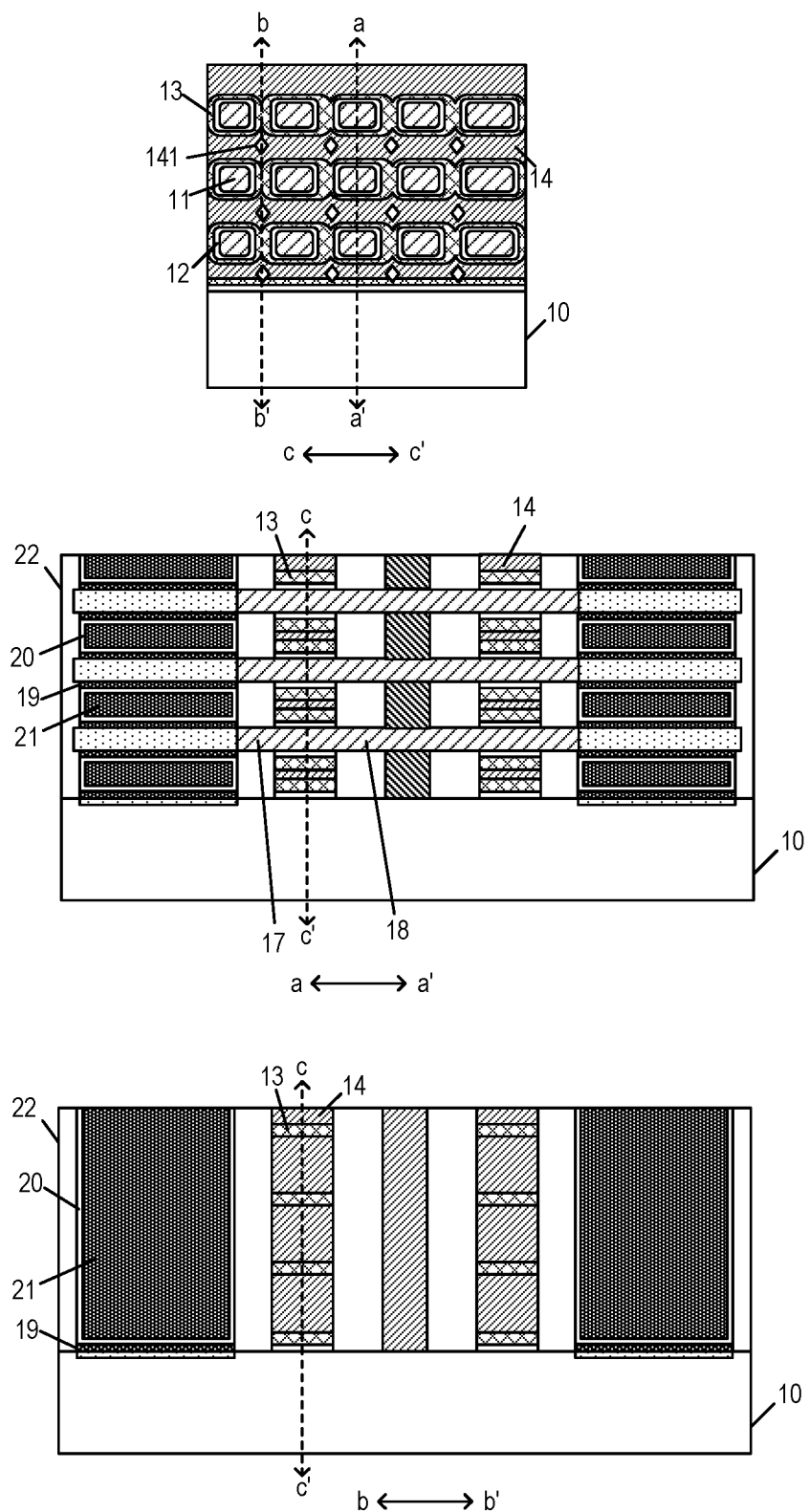

A first filling layer 14 completely filling the plurality of first openings 60 and covering a surface of each of the plurality of word lines 13 is formed, as shown in FIG. 5P.

Figure 5Q:
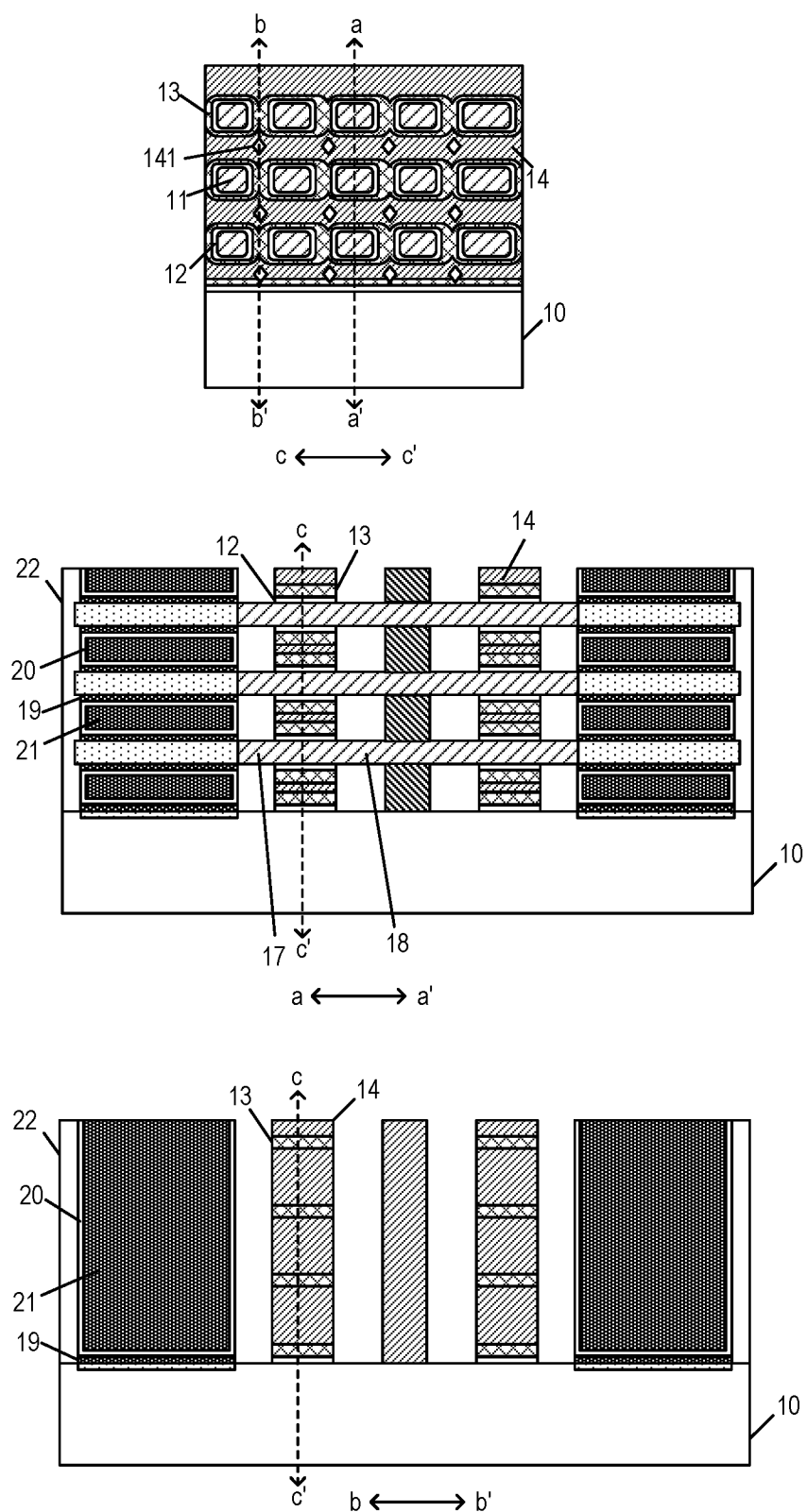

The third filling layer 53 is removed to expose the plurality of first doped areas 17 and the plurality of second doped areas 18, as shown in FIG. 5Q.

Figure 5R:
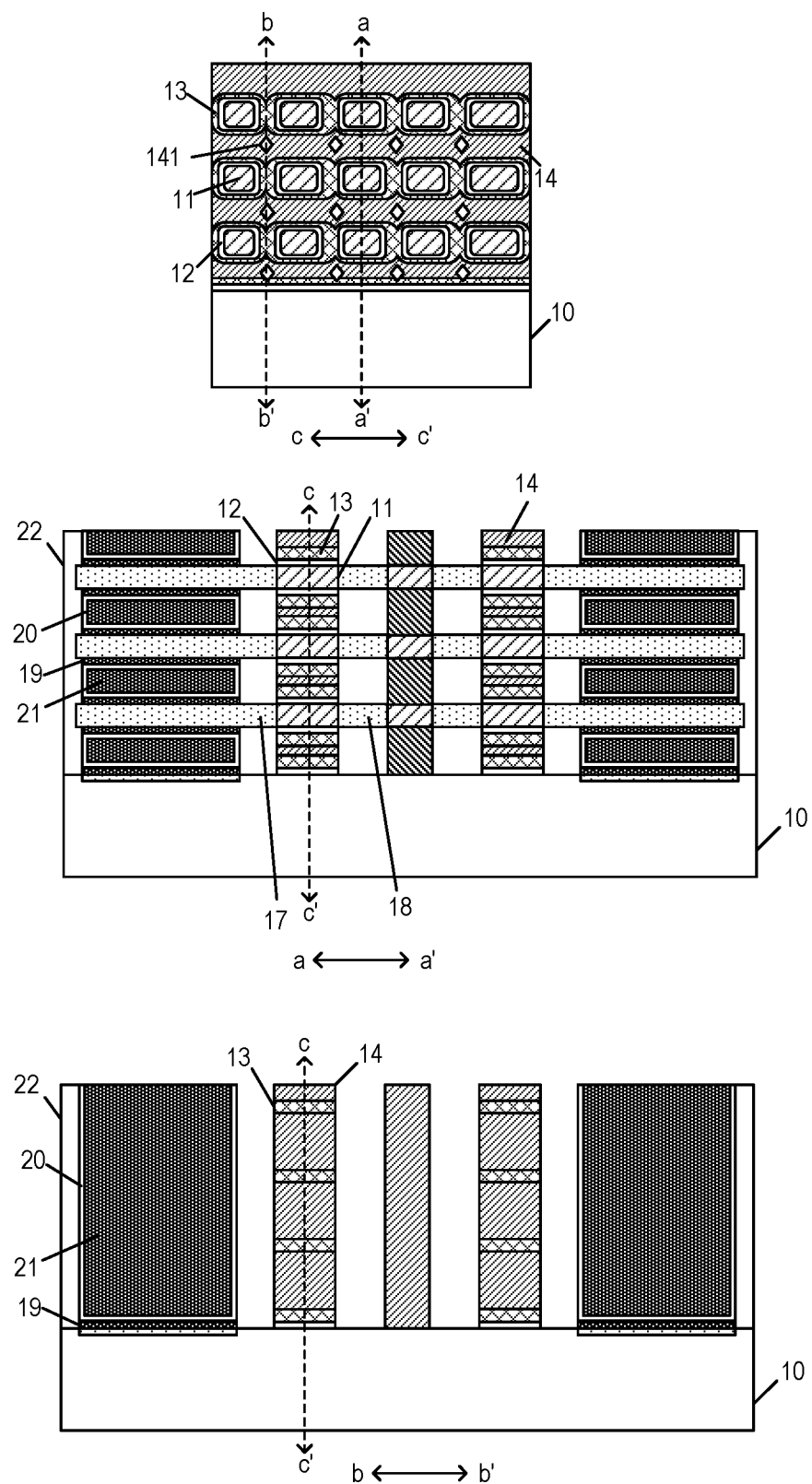

Second doped ions are implanted into the plurality of first doped areas 17 and the plurality of second doped areas 18, as shown in FIG. 5R.

Figure 5S:
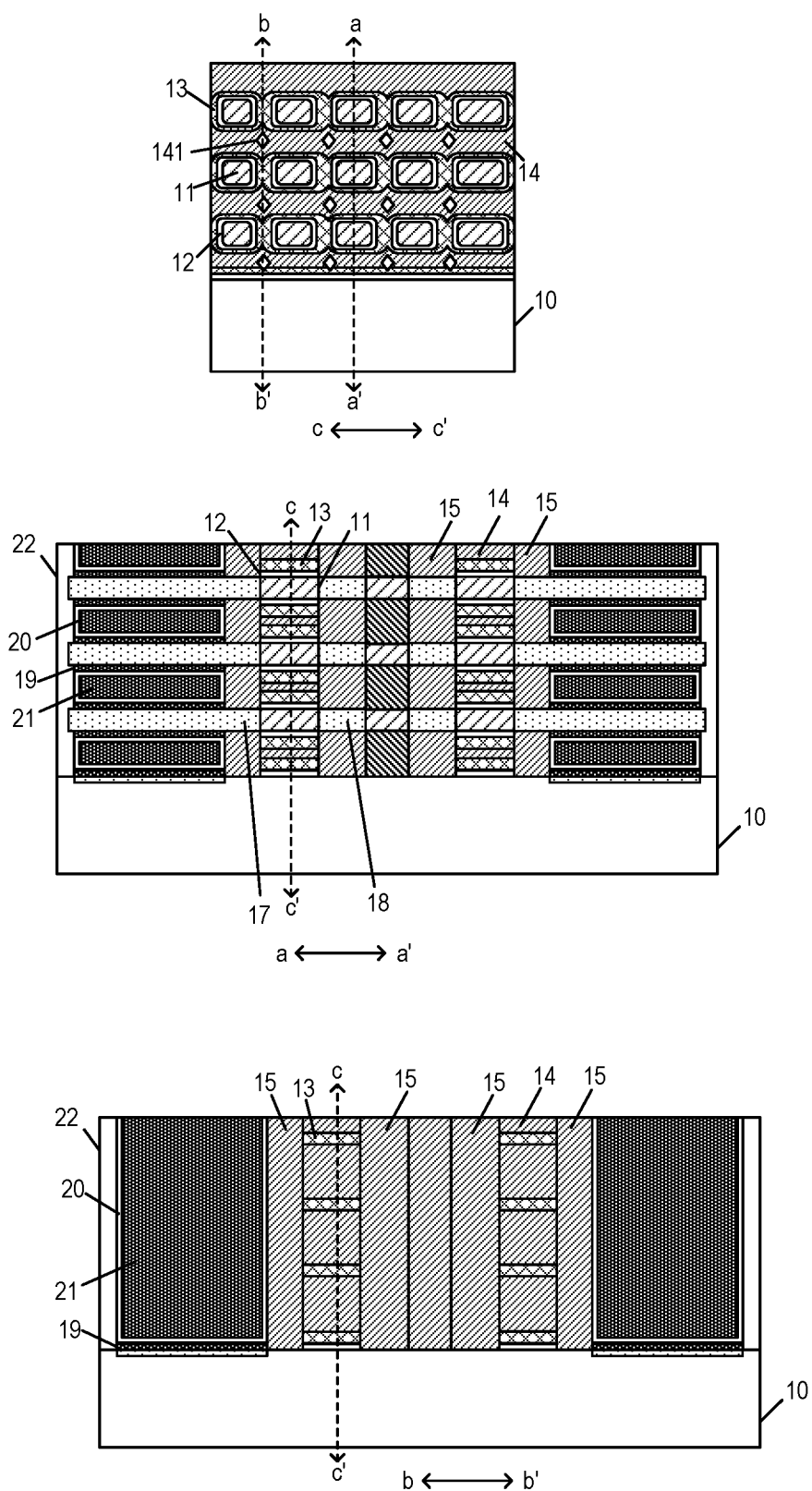
Figure 5U:
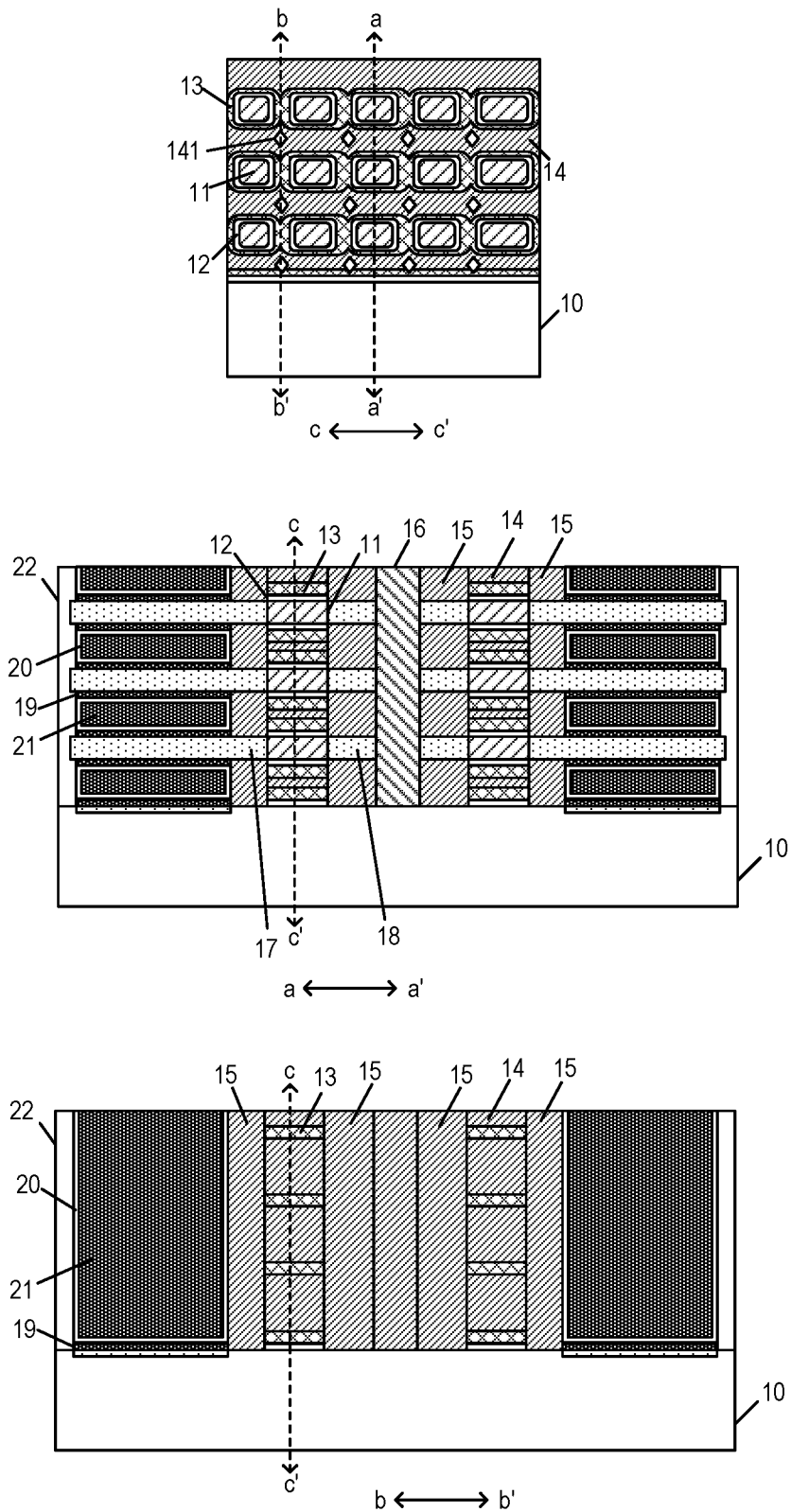

A second filling layer 15 filling the second opening 57 and the third opening 58 and covering the plurality of first doped areas 17 and the plurality of second doped areas 18 is formed, as shown in FIG. 5S.

In some embodiments, the operation that the first filling layer 14 is formed includes the following operation.

An insulating material is deposited in the plurality of first openings 60 through an atomic layer deposition process to form the first filling layer 14 covering the surface of each of the plurality of word lines 13 and to form a plurality of air gaps 141 arranged in the first filling layer 14 and arranged at least between any two word lines 13 which are arranged adjacent to each other in the direction perpendicular to the top surface of the substrate 10.

Specifically, the second doped ions may be implanted into the first doped areas 17 and the second doped areas 18 through a gas phase diffusion process. When the first filling layer 14 is formed through an atomic layer deposition process, the air gaps 141 can also be formed in the first filling layer 14 to increase the electrical isolation effect between the adjacent channel areas 11 spaced apart from each other in the first direction D1. In an embodiment, the air gaps 141 are arranged between two word lines 13 which are arranged adjacent to each other in the direction perpendicular to the top surface of the substrate 10, and between the word line 13 and the substrate 10. The material of the first filling layer 14 may be the same as the material of the second filling layer 15, for example, both are an oxide material (which may be, but is not limited to, silicon dioxide).

In order to reduce the contact resistance between the first semiconductor layer 51 in the capacitor area and the first doped area 17, in some embodiments, a type of the first doped ions is the same as a type of the second doped ions.

In some embodiments, after the second filling layer 15 is formed, the method further includes the following operations.

The stack layer in the bit line area is removed to form a bit line groove 50, as shown in FIG. 5T.

A bit line 16 is formed in the bit line groove 50. The bit line 16 is electrically connected to the plurality of second doped areas 18, as shown in FIG. 5U.

Specifically, the stack layer in the bit line area may be etched in the direction perpendicular to the top surface of the substrate 10 through a dry etching process to form a bit line groove 50 exposing the substrate 10. Then, a metal material such as tungsten is deposited into the bit line groove 50 to form a bit line 16 completely filling the bit line groove 50. One bit line 16 is electrically connected to the plurality of second doped areas 18 spaced apart from each other in the direction perpendicular to the top surface of the substrate 10.

Some embodiments of this specific implementation of the disclosure provide a semiconductor structure and a method for forming a semiconductor structure. The word line structure is formed above the substrate, and the word line structure includes a plurality of word lines extending in the direction parallel to the top surface of the substrate, so that a horizontal word line structure is formed, which not only can be applied to a semiconductor structure with a continuously reduced dimension, but also is beneficial to improve the performance of the semiconductor structure. Moreover, the horizontal word lines in this specific implementation are directly deposited in the first openings exposing the channel areas, so that an edge of each of the formed word lines is flush with an edge of each of the channel areas. Thus, no additional etching process is required after deposition, thereby simplifying the formation process of the semiconductor structure and reducing the manufacturing cost of the semiconductor structure.

The above descriptions are merely preferred implementations of the disclosure. It is should be pointed out that a person of ordinary skill in the art may make several improvements and refinements without departing from the principle of the disclosure, and the improvements and refinements shall fall within the protection scope of the disclosure.

The invention claimed is:

1. A semiconductor structure, comprising:
a substrate;
a laminate structure arranged on the substrate, wherein the laminate structure comprises a plurality of first semiconductor layers spaced apart from each other in a direction perpendicular to a top surface of the substrate, wherein each of the plurality of first semiconductor layers comprises a plurality of channel areas spaced apart from each other in a first direction, and a plurality of first doped areas and a plurality of second doped areas, each of the plurality of first doped areas being arranged on one side of a respective one of the plurality of channel areas in a second direction, and each of the plurality of second doped areas being arranged on another side of the respective one of the plurality of channel areas in the second direction, and wherein each of the first direction and the second direction is a direction parallel to the top surface of the substrate, and the first direction intersects with the second direction; and
a word line structure, wherein the word line structure comprises a plurality of word lines extending in the first direction, and an edge of each of the plurality of word lines is flush with an edge of a respective one of the plurality of channel areas in the second direction;
wherein a distance between any two channel areas of the plurality of channel areas which are arranged adjacent to each other in the first direction is less than a distance between any two channel areas of the plurality of channel areas which are arranged adjacent to each other in the direction perpendicular to the top surface of the substrate.

2. The semiconductor structure according to claim 1, wherein each of the plurality of word lines continuously covers the plurality of channel areas arranged in the first direction, and wherein a medium layer is provided between a respective one of the plurality of word lines and a respective one of the plurality of channel areas, the medium layer covers a surface of the respective one of the plurality of channel areas, the respective one of the plurality of word lines covers a surface of the medium layer, and an edge of the medium layer is flush with an edge of the respective one of the plurality of word lines in the direction perpendicular to the top surface of the substrate.

3. The semiconductor structure according to claim 1, wherein the laminate structure further comprises a plurality of capacitor structures, wherein each of the plurality of capacitor structures comprises a first electrode layer, a dielectric layer and a second electrode layer which are sequentially arranged around a surface of a respective one of the plurality of first semiconductor layers, and each of the plurality of capacitor structures is arranged adjacent to and is electrically connected to a respective one of the plurality of first doped areas, and wherein the respective one of the plurality of first semiconductor layers around which each of the plurality of capacitor structures is arranged is doped with same ions as each of the plurality of first semiconductor layers corresponding to the respective one of the plurality of first doped areas.

4. The semiconductor structure according to claim 3, wherein the laminate structure further comprises a bit line structure adjacent to the plurality of second doped areas, the bit line structure comprises at least one bit line extending in the direction perpendicular to the top surface of the substrate, and wherein in the direction perpendicular to the top surface of the substrate, the at least one bit line is electrically connected to the plurality of second doped areas spaced apart from each other in the direction perpendicular to the top surface of the substrate.

5. The semiconductor structure according to claim 1, wherein the laminate structure further comprises a first filling layer and a second filling layer, the first filling layer is arranged between any two adjacent word lines of the plurality of word lines, and the second filling layer is arranged between any two adjacent first doped areas of the plurality of first doped areas and between any two adjacent second doped areas of the plurality of second doped areas.

6. The semiconductor structure according to claim 5, wherein the plurality of word lines are spaced apart from each other in the direction perpendicular to the top surface of the substrate, and wherein the semiconductor structure further comprises:

a plurality of air gaps arranged in the first filling layer and arranged at least between any two word lines of the plurality of word lines which are arranged adjacent to each other in the direction perpendicular to the top surface of the substrate.

7. The semiconductor structure according to claim 4, further comprising:

at least one support pillar arranged on the substrate on a side of the plurality of capacitor structures away from the plurality of first doped areas, wherein the at least one support pillar is connected at least to the laminate structure.

8. The semiconductor structure according to claim 7, wherein the plurality of first semiconductor layers in the laminate structure extend into the at least one support pillar in the second direction.

9. The semiconductor structure according to claim 8, wherein the at least one support pillar extends in the direction perpendicular to the top surface of the substrate, and a top surface of the at least one support pillar is flush with a top surface of the laminate structure.

10. A method for forming a semiconductor structure, comprising:

forming a substrate and a stack layer arranged on the substrate, wherein the stack layer comprises a plurality of first semiconductor layers and a plurality of second semiconductor layers alternately stacked on one another in a direction perpendicular to a top surface of the substrate, each of the plurality of first semiconductor layers comprises a plurality of channel areas spaced apart from each other in a first direction, and a plurality of first doped areas and a plurality of second doped areas, each of the plurality of first doped areas being arranged on one side of a respective one of the plurality of channel areas in a second direction, and each of the plurality of second doped areas being arranged on another side of the respective one of the plurality of channel areas in the second direction, and wherein each of the first direction and the second direction is a direction parallel to the top surface of the substrate, and the first direction intersects with the second direction;

forming a plurality of first openings respectively exposing the plurality of channel areas; and directly forming a word line structure in each of the plurality of first openings, wherein the word line structure comprises a plurality of word lines extending in the first direction, and each of the plurality of word lines continuously covers the plurality of channel areas spaced apart from each other;

wherein the directly forming the word line structure in each of the plurality of first openings comprises:

depositing a conductive material in the plurality of first openings through an atomic layer deposition process to directly form the word line structure comprising the plurality of word lines spaced apart from each other in the direction perpendicular to the top surface of the substrate, each of the plurality of word lines continuously covering the plurality of channel areas spaced apart from each other in the first direction, wherein an edge of each of the plurality of word lines is flush with an edge of each of the plurality of channel areas in the second direction; and wherein a thickness of each of the plurality of second semiconductor layers is greater than a distance between any two adjacent first openings of the plurality of first openings spaced apart from each other in the first direction.

11. The method for forming the semiconductor structure according to claim 10, wherein before forming the plurality of first openings, the method further comprises:

defining, in the stack layer, a first area and a second area external to the first area;

removing a portion of the stack layer to form a support groove in the second area; and filling the support groove to form a support pillar connected to the plurality of first semiconductor layers in the first area.

12. The method for forming the semiconductor structure according to claim 11, wherein removing the portion of the stack layer to form the support groove in the second area comprises:
removing all of the plurality of second semiconductor layers and a portion of the plurality of first semiconductor layers in the second area to form the support groove, wherein a remaining portion of the plurality of first semiconductor layers extends from the first area into the support groove.

13. The method for forming the semiconductor structure according to claim 11, wherein before forming the plurality of first openings, the method further comprises:
defining a transistor area, a capacitor area and a bit line area in the first area, wherein the capacitor area is arranged on one side of the transistor area in the second direction, and the bit line area is arranged on another side of the transistor area in the second direction, wherein the plurality of channel areas, the plurality of first doped areas and the plurality of second doped areas are arranged in the transistor area, the plurality of first doped areas are arranged adjacent to the capacitor area, and the plurality of second doped areas are arranged adjacent to the bit line area;
forming a second opening exposing the plurality of first doped areas and a third opening exposing the plurality of second doped areas; and
forming a third filling layer completely filling the second opening and the third opening.

14. The method for forming the semiconductor structure according to claim 13, wherein before forming the plurality of first openings, the method further comprises:
removing the plurality of second semiconductor layers in the capacitor area to expose the plurality of first semiconductor layers in the capacitor area;
forming a first electrode layer covering a surface of each of the plurality of first semiconductor layers in the capacitor area;
forming a dielectric layer covering a surface of the first electrode layer; and
forming a second electrode layer covering a surface of the dielectric layer.

15. The method for forming the semiconductor structure according to claim 14, wherein forming the first electrode layer covering the surface of each of the plurality of first semiconductor layers in the capacitor area comprises:
forming the first electrode layer covering the surface of each of the plurality of first semiconductor layers through a selective atomic layer deposition process.

16. The method for forming the semiconductor structure according to claim 14, wherein before forming the first electrode layer covering the surface of each of the plurality of first semiconductor layers in the capacitor area, the method further comprises:
implanting first doped ions into the plurality of first semiconductor layers in the capacitor area,
wherein after forming the word line structure, the method further comprises:
forming a first filling layer completely filling the plurality of first openings and covering a surface of each of the plurality of word lines;
removing the third filling layer to expose the plurality of first doped areas and the plurality of second doped areas;
implanting second doped ions into the plurality of first doped areas and the plurality of second doped areas; and
forming a second filling layer completely filling the second opening and the third opening and covering the plurality of first doped areas and the plurality of second doped areas,
wherein forming the first filling layer comprises:
depositing an insulating material in the plurality of first openings through an atomic layer deposition process to form the first filling layer covering the surface of each of the plurality of word lines and to form a plurality of air gaps arranged in the first filling layer and arranged at least between any two word lines of the plurality of word lines which are arranged adjacent to each other in the direction perpendicular to the top surface of the substrate,
wherein a type of the first doped ions is the same as a type of the second doped ions,
wherein after forming the second filling layer, the method further comprises:
removing the stack layer in the bit line area to form a bit line groove; and
forming a bit line in the bit line groove, wherein the bit line is electrically connected to the plurality of second doped areas.

17. The method for forming the semiconductor structure according to claim 13, wherein before directly forming the word line structure in each of the plurality of first openings, the method further comprises:
oxidizing a surface of each of the plurality of channel areas through an in-situ oxidation process to form a medium layer on the surface of each of the plurality of channel areas.

* * * * *